US012620947B2

(12) United States Patent
Balteanu et al.

(10) Patent No.: US 12,620,947 B2
(45) Date of Patent: May 5, 2026

(54) POWER AMPLIFICATION SYSTEM FOR HIGH MODULATION BANDWIDTH

(71) Applicant: Skyworks Solutions, Inc., Irvine, CA (US)

(72) Inventors: Florinel G. Balteanu, Irvine, CA (US); Serge Francois Drogi, Flagstaff, AZ (US); Sabah Khesbak, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 295 days.

(21) Appl. No.: 18/218,806

(22) Filed: Jul. 6, 2023

(65) Prior Publication Data

US 2024/0014786 A1 Jan. 11, 2024

Related U.S. Application Data

(60) Provisional application No. 63/359,124, filed on Jul. 7, 2022.

(51) Int. Cl.
| | |
|---|---|
| *H03F 3/24* | (2006.01) |
| *H03F 1/02* | (2006.01) |
| *H04B 1/04* | (2006.01) |

(52) U.S. Cl.
CPC ........... *H03F 3/245* (2013.01); *H03F 1/0233* (2013.01); *H04B 1/0475* (2013.01); *H03F 2200/451* (2013.01); *H04B 2001/0416* (2013.01)

(58) Field of Classification Search
CPC .... H03F 1/0227; H03F 1/0233; H03F 1/3247; H03F 2200/102; H03F 2200/451; H03F 3/245; H04B 1/0475; H04B 2001/0416
See application file for complete search history.

(56) References Cited

U.S. PATENT DOCUMENTS

| | | | |
|---|---|---|---|
| 5,545,849 | A | 8/1996 | Kondo |
| 5,966,051 | A | 10/1999 | Griffith et al. |
| 6,255,908 | B1 | 7/2001 | Eidson et al. |
| 6,484,042 | B1 | 11/2002 | Loke |
| 6,529,716 | B1 | 3/2003 | Eidson et al. |
| 6,681,101 | B1 | 1/2004 | Eidson et al. |

(Continued)

OTHER PUBLICATIONS

Sowlati et al., "Quad-Band GSM/GPRS/EDGE Polar Loop Transmitter", IEEE Journal of Solid-State Circuits, vol. 39, No. 12, Dec. 2004, pp. 2179-2189.

*Primary Examiner* — Nguyen T Vo
(74) *Attorney, Agent, or Firm* — VIA LLP

(57) ABSTRACT

A power amplification system is provided herein. In certain embodiments, the power amplification system comprises: a power amplifier configured to amplify an input radio frequency (RF) signal to generate an output RF signal when powered by a supply voltage and biased by a biasing signal; an envelope tracker configured to generate an envelope signal that changes in relation to an envelope of the input RF signal; a mode controller configured to set an envelope tracking (ET) mode of the power amplification system based on a modulation bandwidth of the input RF signal; a supply voltage controller configured to control the supply voltage based on the envelope signal when the ET mode is set to a first mode; and a bias controller configured to control the biasing signal based on the envelope signal when the operation mode is set to a second mode.

20 Claims, 13 Drawing Sheets

(56)  References Cited

U.S. PATENT DOCUMENTS

| | | |
|---|---|---|
| 6,720,839 B1 | 4/2004 | Torre et al. |
| 6,915,141 B2 | 7/2005 | Loke |
| 6,952,567 B2 | 10/2005 | Sowiati |
| 6,996,191 B1 | 2/2006 | Meditz |
| 7,082,169 B2 | 7/2006 | Rozenblit et al. |
| 7,091,790 B2 | 8/2006 | Doherty et al. |
| 7,142,053 B2 | 11/2006 | Phillips et al. |
| 7,277,678 B2 | 10/2007 | Rozenblit et al. |
| 7,405,617 B2 | 7/2008 | Constantin |
| 7,542,741 B2 | 6/2009 | Rozenblit et al. |
| 7,719,354 B2 | 5/2010 | Constantin |
| 8,417,286 B2 | 4/2013 | Gorbachov et al. |
| 8,587,377 B2 | 11/2013 | Khesbak et al. |
| 8,598,950 B2 | 12/2013 | Khesbak |
| 8,717,100 B2 | 5/2014 | Reisner et al. |
| 8,718,188 B2 | 5/2014 | Balteanu et al. |
| 8,797,103 B2 | 8/2014 | Kaczman et al. |
| 8,874,051 B2 | 10/2014 | Rozenblit et al. |
| 8,981,847 B2 | 3/2015 | Balteanu |
| 8,989,682 B2 | 3/2015 | Ripley et al. |
| 9,054,663 B2 | 6/2015 | Reisner et al. |
| 9,083,282 B2 | 7/2015 | Zhang et al. |
| 9,088,249 B2 | 7/2015 | Kaczman et al. |
| 9,118,277 B2 | 8/2015 | Balteanu et al. |
| 9,143,096 B2 | 9/2015 | Balteanu et al. |
| 9,189,430 B2 | 11/2015 | Ross et al. |
| 9,197,128 B2 | 11/2015 | Popplewell et al. |
| 9,209,770 B2 | 12/2015 | Rozenblit et al. |
| 9,231,533 B2 | 1/2016 | Zhang et al. |
| 9,257,940 B2 | 2/2016 | Khesbak |
| 9,258,156 B2 | 2/2016 | Wloczysiak |
| 9,294,043 B2 | 3/2016 | Ripley et al. |
| 9,294,054 B2 | 3/2016 | Balleanu et al. |
| 9,331,653 B2 | 5/2016 | Khesbak et al. |
| 9,356,330 B1 | 5/2016 | Donoghue et al. |
| 9,391,567 B2 | 7/2016 | Kaczman |
| 9,445,371 B2 | 9/2016 | Khesbak et al. |
| 9,455,669 B2 | 9/2016 | Modi et al. |
| 9,503,025 B2 | 11/2016 | Cao et al. |
| 9,548,702 B2 | 1/2017 | Khesbak |
| 9,559,808 B2 | 1/2017 | Rozenblit et al. |
| 9,571,049 B2 | 2/2017 | Zhang et al. |
| 9,571,152 B2 | 2/2017 | Ripley et al. |
| 9,572,052 B2 | 2/2017 | King et al. |
| 9,584,070 B2 | 2/2017 | Balteanu et al. |
| 9,602,056 B2 | 3/2017 | Lehtola |
| 9,602,060 B2 | 3/2017 | Gorbachov et al. |
| 9,606,947 B2 | 3/2017 | Ross et al. |
| 9,621,111 B2 | 4/2017 | Khesbak et al. |
| 9,660,688 B2 | 5/2017 | Kaczman |
| 9,668,215 B2 | 5/2017 | Balteanu et al. |
| 9,698,740 B2 | 7/2017 | Lin et al. |
| 9,806,676 B2 | 10/2017 | Balteanu et al. |
| 9,813,029 B2 | 11/2017 | Zhu et al. |
| 9,817,416 B2 | 11/2017 | Gebeyehu et al. |
| 9,831,834 B2 | 11/2017 | Balteanu et al. |
| 9,859,846 B2 | 1/2018 | Khesbak |
| 9,859,853 B2 | 1/2018 | Kaczman |
| 9,866,176 B2 | 1/2018 | Khesbak |
| 9,876,471 B2 | 1/2018 | Modi et al. |
| 9,876,473 B2 | 1/2018 | Khesbak et al. |
| 9,876,478 B2 | 1/2018 | Modi et al. |
| 9,893,682 B2 | 2/2018 | Zhu et al. |
| 9,893,684 B2 | 2/2018 | Lehtola |
| 9,935,582 B2 | 4/2018 | Balteanu et al. |
| 9,948,241 B2 | 4/2018 | Popplewell et al. |
| 9,973,148 B2 | 5/2018 | Zhu et al. |
| 9,979,349 B2 | 5/2018 | Lehtola |
| 9,991,850 B2 | 6/2018 | Lehtola |
| 9,991,856 B2 | 6/2018 | Khesbak et al. |
| 10,014,889 B2 | 7/2018 | King et al. |
| 10,063,343 B2 | 8/2018 | Rozenblit et al. |
| 10,080,192 B2 | 9/2018 | Balteanu et al. |
| 10,084,411 B2 | 9/2018 | Lehtola |
| 10,103,693 B2 | 10/2018 | Zhu et al. |
| 10,110,169 B2 | 10/2018 | Khesbak et al. |
| 10,135,408 B2 | 11/2018 | Cao et al. |
| 10,164,582 B2 | 12/2018 | Zhu et al. |
| 10,171,053 B2 | 1/2019 | Soliman |
| 10,177,711 B2 | 1/2019 | Lehtola |
| 10,181,820 B2 | 1/2019 | Balteanu et al. |
| 10,205,426 B2 | 2/2019 | Zhu et al. |
| 10,230,339 B2 | 3/2019 | Bayruns et al. |
| 10,236,831 B2 | 3/2019 | Khesbak et al. |
| 10,270,394 B2 | 4/2019 | Drogi et al. |
| 10,277,177 B2 | 4/2019 | Khesbak et al. |
| 10,284,167 B2 | 5/2019 | Srirattana et al. |
| 10,310,527 B2 | 6/2019 | Gebeyehu et al. |
| 10,320,345 B2 | 6/2019 | Sharma et al. |
| 10,333,470 B2 | 6/2019 | Balteanu et al. |
| 10,333,474 B2 | 6/2019 | Alon et al. |
| 10,340,961 B2 | 7/2019 | King et al. |
| 10,374,556 B2 | 8/2019 | Lam et al. |
| 10,381,983 B2 | 8/2019 | Balteanu et al. |
| 10,381,985 B2 | 8/2019 | Zhu et al. |
| 10,382,147 B2 | 8/2019 | Ripley et al. |
| 10,402,356 B2 | 9/2019 | Ross et al. |
| 10,404,217 B2 | 9/2019 | Popplewell et al. |
| 10,439,558 B2 | 10/2019 | Sharma et al. |
| 10,439,685 B2 | 10/2019 | Pehlke et al. |
| 10,447,207 B2 | 10/2019 | Zhu et al. |
| 10,454,428 B2 | 10/2019 | Khesback et al. |
| 10,454,429 B2 | 10/2019 | Balteanu et al. |
| 10,477,550 B2 | 11/2019 | Balleanu |
| 10,505,501 B2 | 12/2019 | Gorbachov et al. |
| 10,516,368 B2 | 12/2019 | Balteanu et al. |
| 10,536,116 B2 | 1/2020 | Balteanu et al. |
| 10,574,191 B2 | 2/2020 | Zhu et al. |
| 10,574,192 B2 | 2/2020 | Zhu et al. |
| 10,615,757 B2 | 4/2020 | Balteanu et al. |
| 10,642,296 B2 | 5/2020 | Gebeyehu et al. |
| 10,651,802 B2 | 5/2020 | Khesbak et al. |
| 10,666,200 B2 | 5/2020 | Gebeyehu et al. |
| 10,707,826 B2 | 7/2020 | Srirattana et al. |
| 10,778,149 B2 | 9/2020 | Lehtola |
| 10,784,819 B2 | 9/2020 | Sharma et al. |
| 10,790,783 B2 | 9/2020 | Lehtola |
| 10,804,866 B2 | 10/2020 | Lehtola |
| 10,804,867 B2 | 10/2020 | Lehtola |
| 10,812,023 B2 | 10/2020 | Balleanu et al. |
| 10,812,026 B2 | 10/2020 | Zhu et al. |
| 10,862,430 B2 | 12/2020 | Drogi et al. |
| 10,873,297 B2 | 12/2020 | Khesbak et al. |
| 10,958,218 B2 | 3/2021 | Gebeyehu et al. |
| 10,985,703 B2 | 4/2021 | Balteanu et al. |
| 10,985,711 B2 | 4/2021 | Balteanu et al. |
| 11,018,726 B2 | 5/2021 | Pehlke et al. |
| 11,038,471 B2 | 6/2021 | Drogi et al. |
| 11,064,491 B2 | 7/2021 | Balteanu |
| 11,082,021 B2 | 8/2021 | Lin et al. |
| 11,165,393 B2 | 11/2021 | Pehlke et al. |
| 11,165,514 B2 | 11/2021 | Balteanu et al. |
| 11,223,323 B2 | 1/2022 | Drogi et al. |
| 11,223,324 B2 | 1/2022 | Balteanu et al. |
| 11,223,325 B2 | 1/2022 | Drogi et al. |
| 11,239,800 B2 | 2/2022 | Drogi et al. |
| 11,374,538 B2 | 6/2022 | Drogi et al. |
| 11,387,797 B2 | 7/2022 | Drogi et al. |
| 11,394,347 B2 | 7/2022 | Gebeyehu et al. |
| 11,431,357 B2 | 8/2022 | Balteanu et al. |
| 11,444,576 B2 | 9/2022 | Drogi et al. |
| 11,469,714 B2 | 10/2022 | Drogi et al. |
| 11,476,815 B2 | 10/2022 | Drogi et al. |
| 11,482,975 B2 | 10/2022 | Lyalin et al. |
| 11,496,097 B2 | 11/2022 | Sharma et al. |
| 11,496,101 B2 | 11/2022 | Alon et al. |
| 11,539,559 B2 | 12/2022 | Briseno-vidrios et al. |
| 11,545,947 B2 | 1/2023 | Lehtola et al. |
| 11,558,015 B2 | 1/2023 | Balleanu et al. |
| 11,575,349 B2 | 2/2023 | Lehtola |
| 11,595,005 B2 | 2/2023 | Balteanu et al. |
| 11,595,006 B2 | 2/2023 | Khesbak et al. |
| 11,626,933 B2 | 4/2023 | Balteanu et al. |
| 11,658,615 B2 | 5/2023 | Balteanu et al. |

(56)     References Cited

U.S. PATENT DOCUMENTS

| | | | |
|---|---|---|---|
| 11,677,357 B2 | 6/2023 | Drogi et al. | |
| 11,677,368 B2 | 6/2023 | Lyalin et al. | |
| 11,683,013 B2 | 6/2023 | Drogi et al. | |
| 2009/0115520 A1 | 5/2009 | Ripley et al. | |
| 2013/0037653 A1 | 2/2013 | Van Der | |
| 2017/0005624 A1 | 1/2017 | Zhu et al. | |
| 2017/0005626 A1 | 1/2017 | Zhu et al. | |
| 2018/0076772 A1* | 3/2018 | Khesbak | H03G 1/0029 |
| 2018/0159476 A1 | 6/2018 | Balleanu et al. | |
| 2018/0159478 A1 | 6/2018 | Balteanu et al. | |
| 2018/0331657 A1 | 11/2018 | Zhu et al. | |
| 2019/0312557 A1 | 10/2019 | Bayruns et al. | |
| 2019/0319720 A1 | 10/2019 | Ripley et al. | |
| 2019/0363684 A1 | 11/2019 | Sharma et al. | |
| 2019/0379332 A1 | 12/2019 | Ripley | |
| 2020/0127619 A1 | 4/2020 | Khesbak et al. | |
| 2020/0162028 A1 | 5/2020 | Balteanu et al. | |
| 2021/0099136 A1* | 4/2021 | Drogi | H03F 3/245 |
| 2021/0211145 A1 | 7/2021 | Loh et al. | |
| 2021/0384875 A1 | 12/2021 | Lyalin et al. | |
| 2021/0384880 A1 | 12/2021 | Lin et al. | |
| 2022/0014152 A1 | 1/2022 | Gebeyehu et al. | |
| 2022/0014153 A1 | 1/2022 | Pehike | |
| 2022/0069775 A1 | 3/2022 | Balteanu et al. | |
| 2022/0069787 A1 | 3/2022 | King et al. | |
| 2022/0069788 A1 | 3/2022 | King et al. | |
| 2022/0085764 A1 | 3/2022 | Drogi et al. | |
| 2022/0085765 A1 | 3/2022 | Drogi et al. | |
| 2022/0116249 A1 | 4/2022 | Briseno-vidrios et al. | |
| 2022/0278650 A1 | 9/2022 | Ripley et al. | |
| 2022/0286093 A1 | 9/2022 | Drogi et al. | |
| 2022/0302935 A1 | 9/2022 | Drogi et al. | |
| 2022/0311386 A1 | 9/2022 | Gebeyehu et al. | |
| 2022/0385237 A1 | 12/2022 | Lehtola et al. | |
| 2022/0393657 A1 | 12/2022 | Drogi et al. | |
| 2022/0416723 A1 | 12/2022 | Ripley | |
| 2023/0063006 A1 | 3/2023 | Khesbak et al. | |
| 2023/0065303 A1 | 3/2023 | Khesbak et al. | |
| 2023/0065932 A1 | 3/2023 | Khesbak et al. | |
| 2023/0082437 A1 | 3/2023 | Balteanu et al. | |
| 2023/0104305 A1 | 4/2023 | Lyalin et al. | |
| 2023/0105489 A1 | 4/2023 | Lyalin et al. | |
| 2023/0113416 A1 | 4/2023 | Datta et al. | |
| 2023/0120462 A1 | 4/2023 | Balteanu et al. | |
| 2023/0124129 A1 | 4/2023 | Lin et al. | |
| 2023/0155554 A1 | 5/2023 | Balteanu et al. | |
| 2023/0179155 A1 | 6/2023 | Alon et al. | |
| 2023/0208688 A1 | 6/2023 | Briseno-vidrios et al. | |
| 2023/0239092 A1* | 7/2023 | Laufer | H04B 17/24 |
| | | | 370/329 |

* cited by examiner mXn DL MIMO nXm UL MIMO

POWER AMPLIFICATION SYSTEM FOR HIGH MODULATION BANDWIDTH

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to power amplifiers for use in radio frequency (RF) electronics.

Description of the Related Technology

Power amplifiers are used in radio frequency (RF) communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In some aspects, the techniques described herein relate to a power amplification system including a power amplifier configured to amplify an input radio frequency signal to generate an output radio frequency signal when powered by a supply voltage and biased by a biasing signal. The system can further include an envelope tracker configured to generate an envelope signal that changes in relation to an envelope of the input radio frequency signal; a mode controller configured to set an envelope tracking mode of the power amplification system based on a modulation bandwidth of the input radio frequency signal; a supply voltage controller configured to control the supply voltage based on the envelope signal when the envelope tracking mode is set to a first mode. The system can additionally have a bias controller configured to control the biasing signal based on the envelope signal when the envelope tracking mode is set to a second mode.

In some aspects, the techniques described herein relate to a power amplification system wherein the mode controller is configured to set the envelope tracking mode to the first mode when the modulation bandwidth of the input radio frequency signal is higher than a threshold value.

In some aspects, the techniques described herein relate to a power amplification system wherein the mode controller is configured to set the envelope tracking mode to the second mode when the modulation bandwidth of the input radio frequency signal is lower than a threshold value.

In some aspects, the techniques described herein relate to a power amplification system wherein the modulation bandwidth of the input radio frequency signal is determined based on a number of resource blocks included in a single carrier.

In some aspects, the techniques described herein relate to a power amplification system wherein the supply voltage controller includes an AC coupler to extract an AC component of the envelope signal and to provide the supply voltage with the extracted AC component of the envelope signal.

In some aspects, the techniques described herein relate to a power amplification system wherein the mode controller is disposed between the supply voltage controller and a node connecting a power source and the power amplifier.

In some aspects, the techniques described herein relate to a power amplification system wherein the bias controller is configured to generate a multi-level biasing signal based on the envelope signal.

In some aspects, the techniques described herein relate to a power amplification system wherein the bias controller includes a feedback loop to detect the output radio frequency signal.

In some aspects, the techniques described herein relate to a power amplification system wherein the biasing signal is controlled further based on the detected output radio frequency signal.

In some aspects, the techniques described herein relate to a power amplification system wherein the bias controller further includes an adjustment circuit to adjust the input radio frequency signal based on the detected output radio frequency signal to enhance a linearity of the power amplification system.

In some aspects, the techniques described herein relate to a power amplification system wherein the adjustment circuit is a digital pre-distortion circuit.

In some aspects, the techniques described herein relate to a radio frequency module. The module can include a packaging substrate configured to receive a plurality of components; and a power amplification system implemented on the packaging substrate. The power amplification system can include a power amplifier configured to amplify an input radio frequency signal to generate an output radio frequency signal when powered by a supply voltage and biased by a biasing signal. The module can also have an envelope tracker configured to generate an envelope signal that changes in relation to an envelope of the input radio frequency signal. The module can also have a mode controller configured to set an envelope tracking mode of the power amplification system based on a modulation bandwidth of the input radio frequency signal. The module can additionally include a supply voltage controller configured to control the supply voltage based on the envelope signal when the envelope tracking mode is set to a first mode. The module can have a bias controller configured to control the biasing signal based on the envelope signal when the envelope tracking mode is set to a second mode.

In some aspects, the techniques described herein relate to a radio frequency module wherein the radio frequency module is a front-end module.

In some aspects, the techniques described herein relate to a radio frequency module wherein the mode controller is configured to set the envelope tracking mode to the first mode when the modulation bandwidth of the input radio frequency signal is higher than a threshold value.

3

In some aspects, the techniques described herein relate to a radio frequency module wherein the mode controller is configured to set the envelope tracking mode to the second mode when the modulation bandwidth of the input radio frequency signal is lower than a threshold value.

In some aspects, the techniques described herein relate to a radio frequency module wherein the modulation bandwidth of the input radio frequency signal is determined based on a number of resource blocks included in a single carrier.

In some aspects, the techniques described herein relate to a radio frequency module wherein the supply voltage controller includes an AC coupler to extract an AC component of the envelope signal and to provide the supply voltage with the extracted AC component of the envelope signal.

In some aspects, the techniques described herein relate to a radio frequency module wherein the mode controller is disposed between the supply voltage controller and a node connecting a power source and the power amplifier.

In some aspects, the techniques described herein relate to a radio frequency module wherein the bias controller is configured to generate a multi-level biasing signal based on the envelope signal.

In some aspects, the techniques described herein relate to a radio frequency module wherein the bias controller includes a feedback loop to detect the output radio frequency signal.

In some aspects, the techniques described herein relate to a radio frequency module wherein the biasing signal is controlled further based on the detected output radio frequency signal.

In some aspects, the techniques described herein relate to a radio frequency module wherein the bias controller further includes an adjustment circuit to adjust the input radio frequency signal based on the detected output radio frequency signal to enhance a linearity of the power amplification system.

In some aspects, the techniques described herein relate to a radio frequency module wherein the adjustment circuit is a digital pre-distortion circuit.

In some aspects, the techniques described herein relate to a mobile device including a transceiver configured to generate a radio frequency signal. The mobile device can also have a power management system including an envelope tracker configured to generate a power amplifier supply voltage that changes is relation to an envelope of the radio frequency signal. The mobile device can further include a front end system including a power amplification system including a power amplifier configured to amplify an input radio frequency signal to generate an output radio frequency signal when powered by a supply voltage and biased by a biasing signal. The power amplification system can also have an envelope tracker configured to generate an envelope signal that changes in relation to an envelope of the input radio frequency signal. The power amplification system can further include a mode controller configured to set an envelope tracking mode of the power amplification system based on a modulation bandwidth of the input radio frequency signal. The power amplification system can also have a supply voltage controller configured to control the supply voltage based on the envelope signal when the envelope tracking mode is set to a first mode. The power amplification system can additionally include a bias controller configured to control the biasing signal based on the envelope signal when the envelope tracking mode is set to a second mode.

In some aspects, the techniques described herein relate to a mobile device wherein the mode controller is configured to set the envelope tracking mode to the first mode when the modulation bandwidth of the input radio frequency signal is higher than a threshold value.

In some aspects, the techniques described herein relate to a mobile device wherein the mode controller is configured to set the envelope tracking mode to the second mode when the modulation bandwidth of the input radio frequency signal is lower than a threshold value.

In some aspects, the techniques described herein relate to a mobile device wherein the modulation bandwidth of the input radio frequency signal is determined based on a number of resource blocks included in a single carrier.

In some aspects, the techniques described herein relate to a mobile device the supply voltage controller includes an AC coupler to extract an AC component of the envelope signal and to provide the supply voltage with the extracted AC component of the envelope signal.

In some aspects, the techniques described herein relate to a mobile device wherein the mode controller is disposed between the supply voltage controller and a node connecting a power source and the power amplifier.

In some aspects, the techniques described herein relate to a mobile device wherein the bias controller is configured to generate a multi-level biasing signal based on the envelope signal.

In some aspects, the techniques described herein relate to a mobile device wherein the bias controller includes a feedback loop to detect the output radio frequency signal.

In some aspects, the techniques described herein relate to a mobile device wherein the biasing signal is controlled further based on the detected output radio frequency signal.

In some aspects, the techniques described herein relate to a mobile device wherein the bias controller further includes an adjustment circuit to adjust the input radio frequency signal based on the detected output radio frequency signal to enhance a linearity of the power amplification system.

In some aspects, the techniques described herein relate to a mobile device wherein the adjustment circuit is a digital pre-distortion circuit.

DETAILED DESCRIPTION OF EMBODIMENTS

Figure 1:
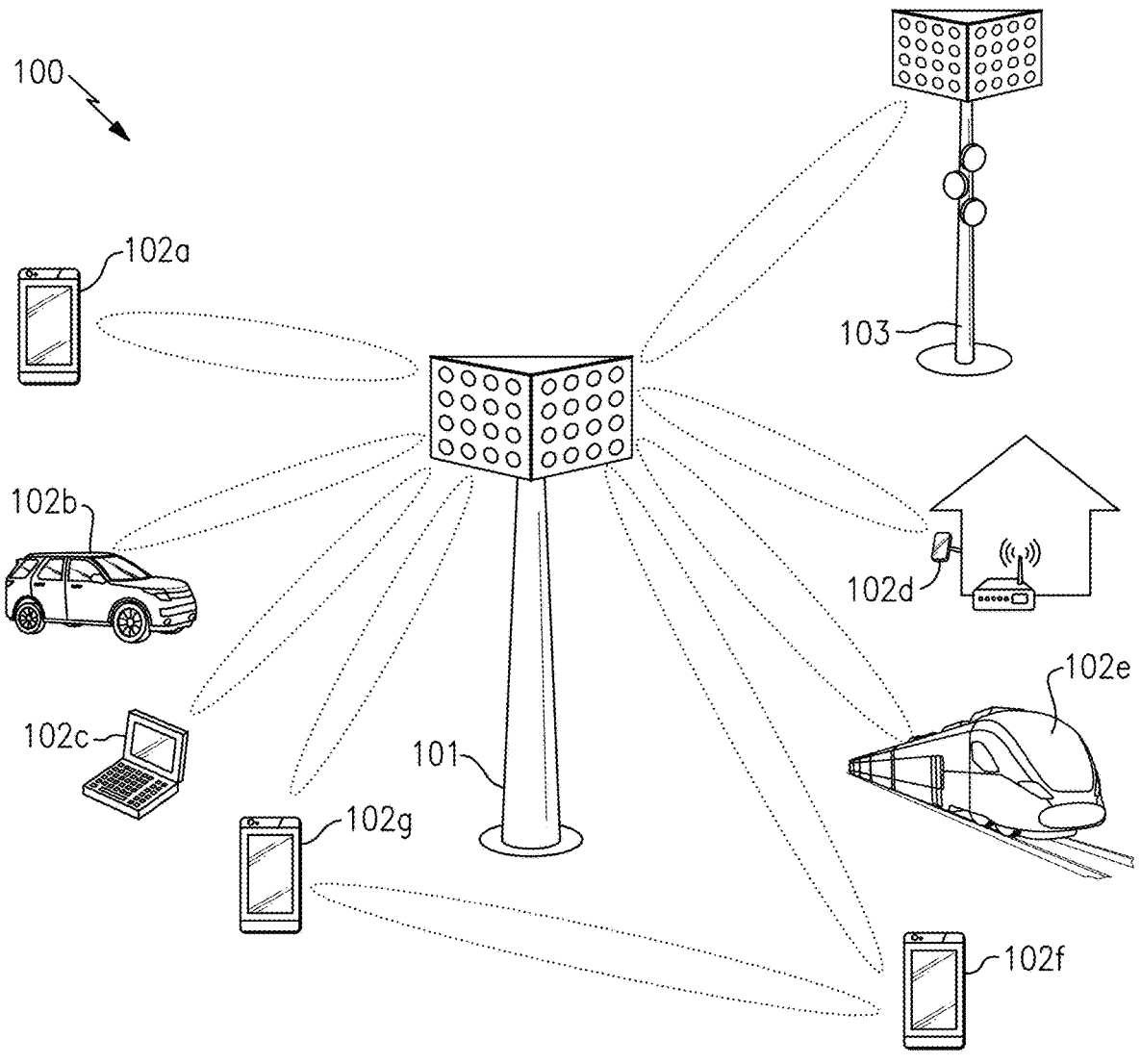
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a communication network 100. The communication network 100 includes a macro cell base station 101, a small cell base station 103, and various examples of user equipment (UE), including a first mobile device 102a, a wireless-connected car 102b, a laptop 102c, a stationary wireless device 102d, a wireless-connected train 102e, a second mobile device 102f, and a third mobile device 102g.

Although specific examples of base stations and user equipment are illustrated in FIG. 1, a communication network can include base stations and user equipment of a wide variety of types and/or numbers.

For instance, in the example shown, the communication network 100 includes the macro cell base station 101 and the small cell base station 103. The small cell base station 103 can operate with relatively lower power, shorter range, and/or with fewer concurrent users relative to the macro cell base station 101. The small cell base station 103 can also be referred to as a femtocell, a picocell, or a microcell. Although the communication network 100 is illustrated as including two base stations, the communication network 100 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 100 of FIG. 1 supports communications using a variety of cellular technologies, including, for example, 4G LTE and 5G NR. In certain implementations, the communication network 100 is further adapted to provide a wireless local area network (WLAN), such as WiFi. Although various examples of communication technologies have been provided, the communication network 100 can be adapted to support a wide variety of communication technologies.

Various communication links of the communication network 100 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 100 can be implemented to support self-fronthaul and/or self-backhaul (for instance, as between mobile device 102g and mobile device 102f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 100 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 100 of FIG. 1 can be used to support a wide variety of advanced communication features, including, but not limited to, eMBB, uRLLC, and/or mMTC.

Figure 2A:
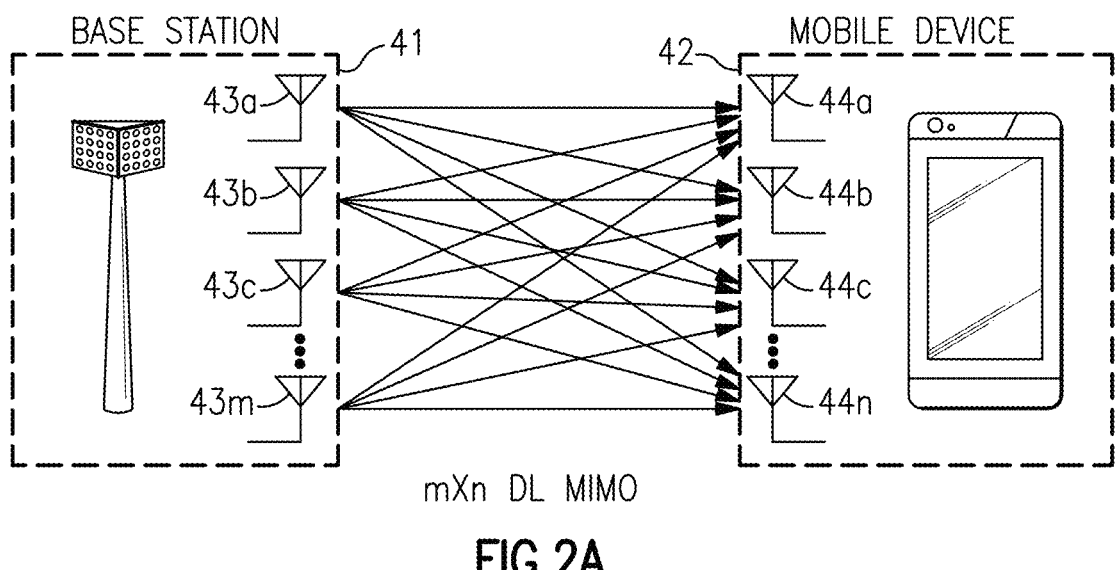
FIG. 2A is a schematic diagram of one example of a downlink channel using multi-input and multi-output (MIMO) communications.
Figure 2B:
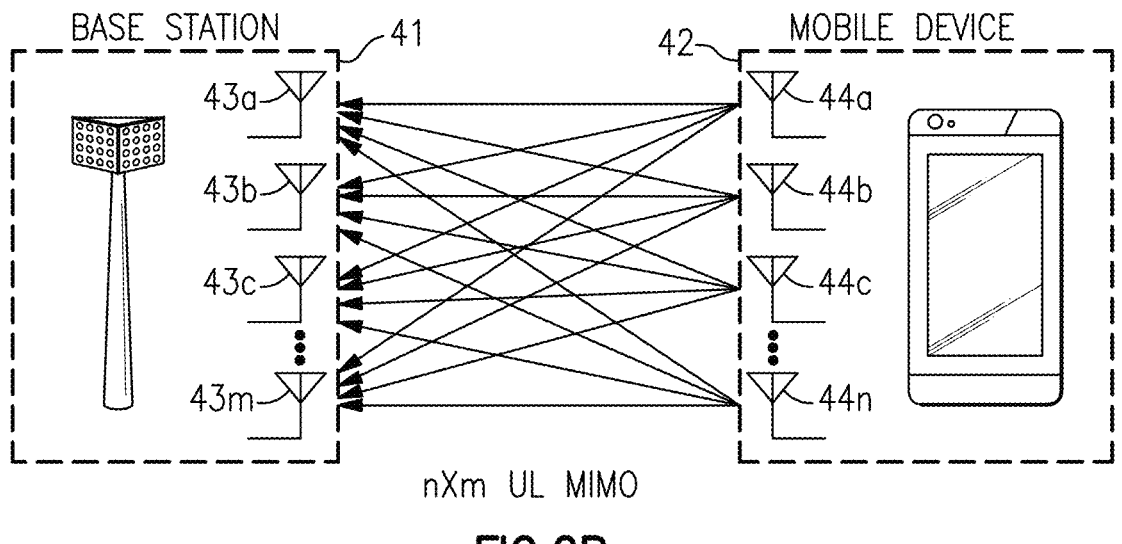
FIG. 2B is schematic diagram of one example of an uplink channel using MIMO communications.

FIG. 2A is a schematic diagram of one example of a downlink channel using multi-input and multi-output (MIMO) communications. FIG. 2B is a schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 2A, downlink MIMO communications are provided by transmitting using M antennas 43a, 43b, 43c, . . . 43m of the base station 41 and receiving using N antennas 44a, 44b, 44c, . . . 44 n of the mobile device 42. Accordingly, FIG. 2A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 2B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 2B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3:
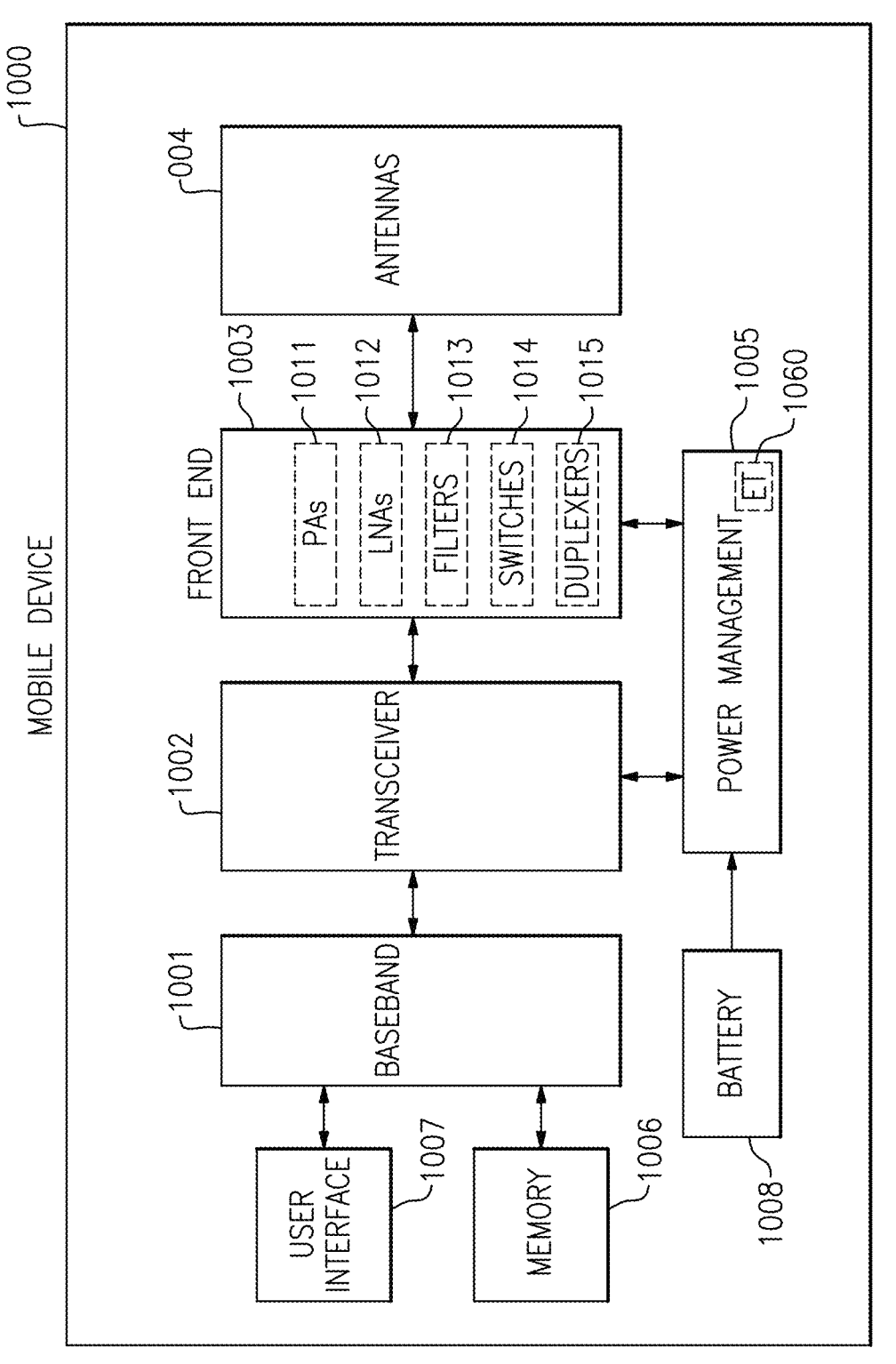
FIG. 3 is a schematic diagram of one embodiment of a mobile device.

FIG. 3 is a schematic diagram of one example of a mobile device 1000. The mobile device 1000 includes a baseband system 1001, a transceiver 1002, a front end system 1003, antennas 1004, a power management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and Zig-Bee), WMAN (for instance, WiMax), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 3 as the transceiver 1002. In one example, separate components (for instance, separate circuits or dies) can be provided for handling certain types of RF signals.

The front end system 1003 aids in conditioning signals transmitted to and/or received from the antennas 1004. In the illustrated embodiment, the front end system 1003 includes power amplifiers (PAs) 1011, low noise amplifiers (LNAs) 1012, filters 1013, switches 1014, and duplexers 1015. However, other implementations are possible.

For example, the front end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas associated transmitting and/ or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 3, the baseband system 1001 is coupled to the memory 1006 of facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 3 includes an envelope tracker 1060. As shown in FIG. 3, the power management system 1005 receives a battery voltage form the battery 1008. The battery 1008 can be any suitable battery for use in the mobile device 1000, including, for example, a lithium-ion battery.

The mobile device 1000 of FIG. 3 illustrates one example of an RF communication system that can include power amplifier(s) implemented in accordance with one or more features of the present disclosure. However, the teachings herein are applicable to RF communication systems implemented in a wide variety of ways.

Figure 4:
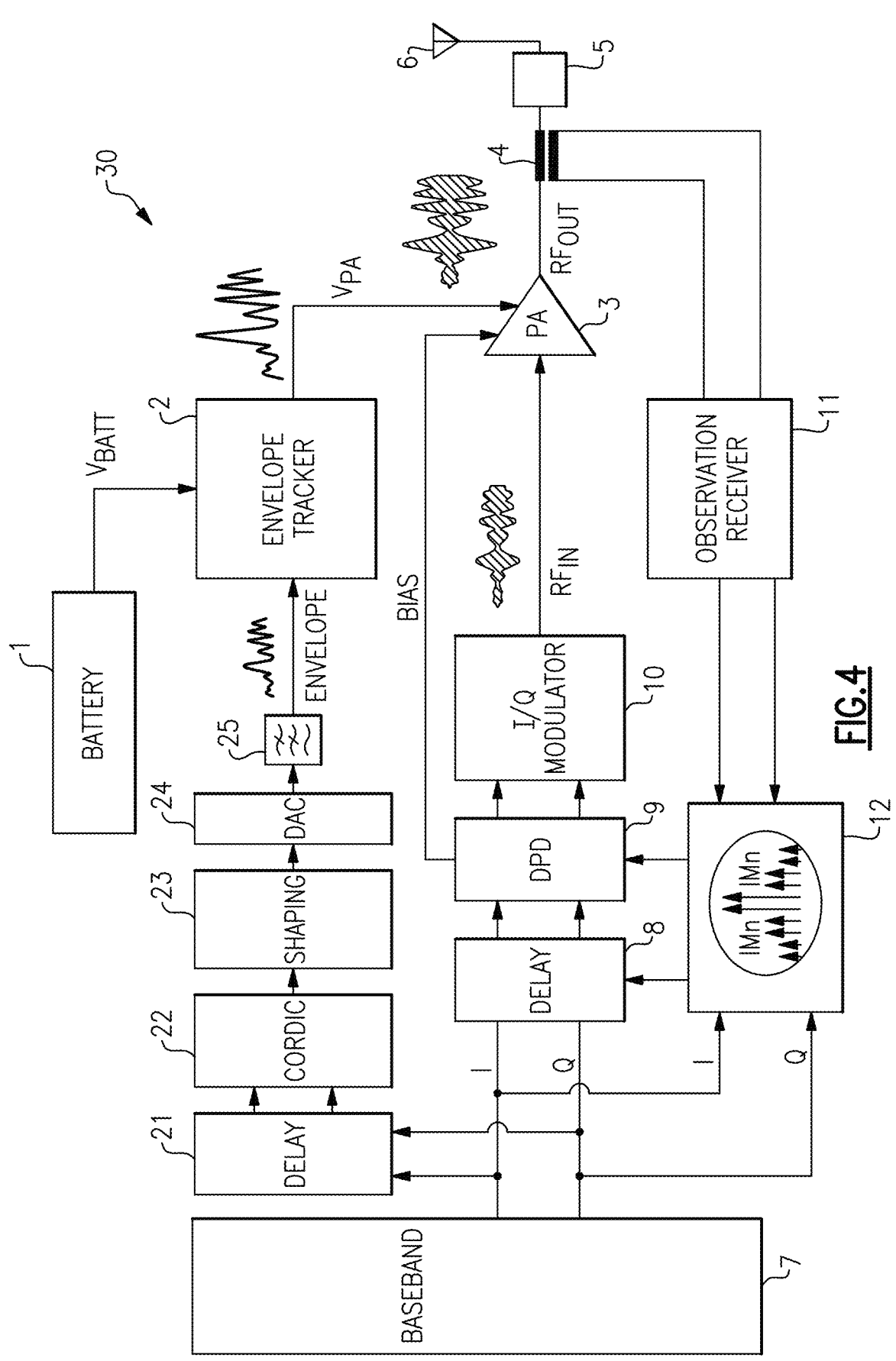
FIG. 4 is a schematic diagram of one embodiment of a transmit system for transmitting radio frequency (RF) signals from a mobile device.

FIG. 4 is a schematic diagram of one embodiment of a transmit system for transmitting RF signals from a mobile device. The transmit system 30 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/Q modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25. A bias control signal received by the PA module 3, is represented here as originating from the DPD block 9. In such a configuration, the DPD system becomes capable of applying a modulated signal to both the RF and the PA bias, and optimize the bias and RF signals in their respective bandwidths. For a low BW signal, bias modulation becomes the dominant mode of controlling the PA, enabling best efficiency in these conditions.

The transmit system 30 of FIG. 4 illustrates one example of an RF communication system that can include power amplifier(s) implemented in accordance with one or more features of the present disclosure. However, the teachings herein are applicable to RF communication systems implemented in a wide variety of ways.

The baseband processor 7 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 10 in a digital format. The baseband processor 7 can be any suitable processor configured to process a baseband signal. For instance, the baseband processor 7 can include a digital signal processor, a microprocessor, a programmable core, or any combination thereof.

The signal delay circuit 8 provides adjustable delay to the I and Q signals to aid in controlling relative alignment between the envelope signal and the RF signal $RF_{IN}$. The amount of delay provided by the signal delay circuit 8 is controlled based on amount of intermodulation detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the DPD provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3. The DPD circuit 9 is configured to provide the power amplifier 3 with bias signal, which is controlled by a loop through the baseband processor 7. Therefore, the power amplifier 3 is powered by a supply voltage and biased by a bias signal.

The I/Q modulator 10 receives the digitally pre-distorted I and Q signals, which are processed to generate an RF signal $RF_{IN}$. For example, the I/Q modulator 10 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 3. In certain implementations, the I/Q modulator 10 can include one or more filters configured to filter frequency content of signals processed therein.

The envelope delay circuit 21 delays the I and Q signals from the baseband processor 7. Additionally, the CORDIC circuit 22 processes the delayed I and Q signals to generate a digital envelope signal representing an envelope of the RF signal RF$_{IN}$. Although FIG. 4 illustrates an implementation using the CORDIC circuit 22, an envelope signal can be obtained in other ways.

The shaping circuit 23 operates to shape the digital envelope signal to enhance the performance of the transmit system 30. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to an analog envelope signal. Additionally, the analog envelope signal is filtered by the reconstruction filter 25 to generate an envelope signal suitable for use by the envelope tracker 2. In certain implementations, the reconstruction filter 25 includes a low pass filter.

With continuing reference to FIG. 4, the envelope tracker 2 receives the envelope signal from the reconstruction filter 25 and a battery voltage V$_{BATT}$ from the battery 1, and uses the envelope signal to generate a power amplifier supply voltage V$_{PA}$ for the power amplifier 3 that changes in relation to the envelope of the RF signal RF$_{IN}$. The power amplifier 3 receives the RF signal RF$_{IN}$ from the I/Q modulator 10, and provides an amplified RF signal RF$_{OUT}$ to the antenna 6 through the duplexing and switching circuit 5, in this example.

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for down converting I and Q signal components of the sensed output signal, and DACs for generating I and Q observation signals from the downconverted signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the envelope signal and the RF signal RF$_{IN}$.

By including a feedback path from the output of the power amplifier 3 and baseband, the I and Q signals can be dynamically adjusted to optimize the operation of the transmit system 30. For example, configuring the transmit system 30 in this manner can aid in providing power control, compensating for transmitter impairments, and/or in performing DPD.

Although illustrated as a single stage, the power amplifier 3 can include one or more stages. Furthermore, RF communication systems such as mobile devices can include multiple power amplifiers. In such implementations, separate envelope trackers can be provided for different power amplifiers and/or one or more shared envelope trackers can be used.

Figure 5:
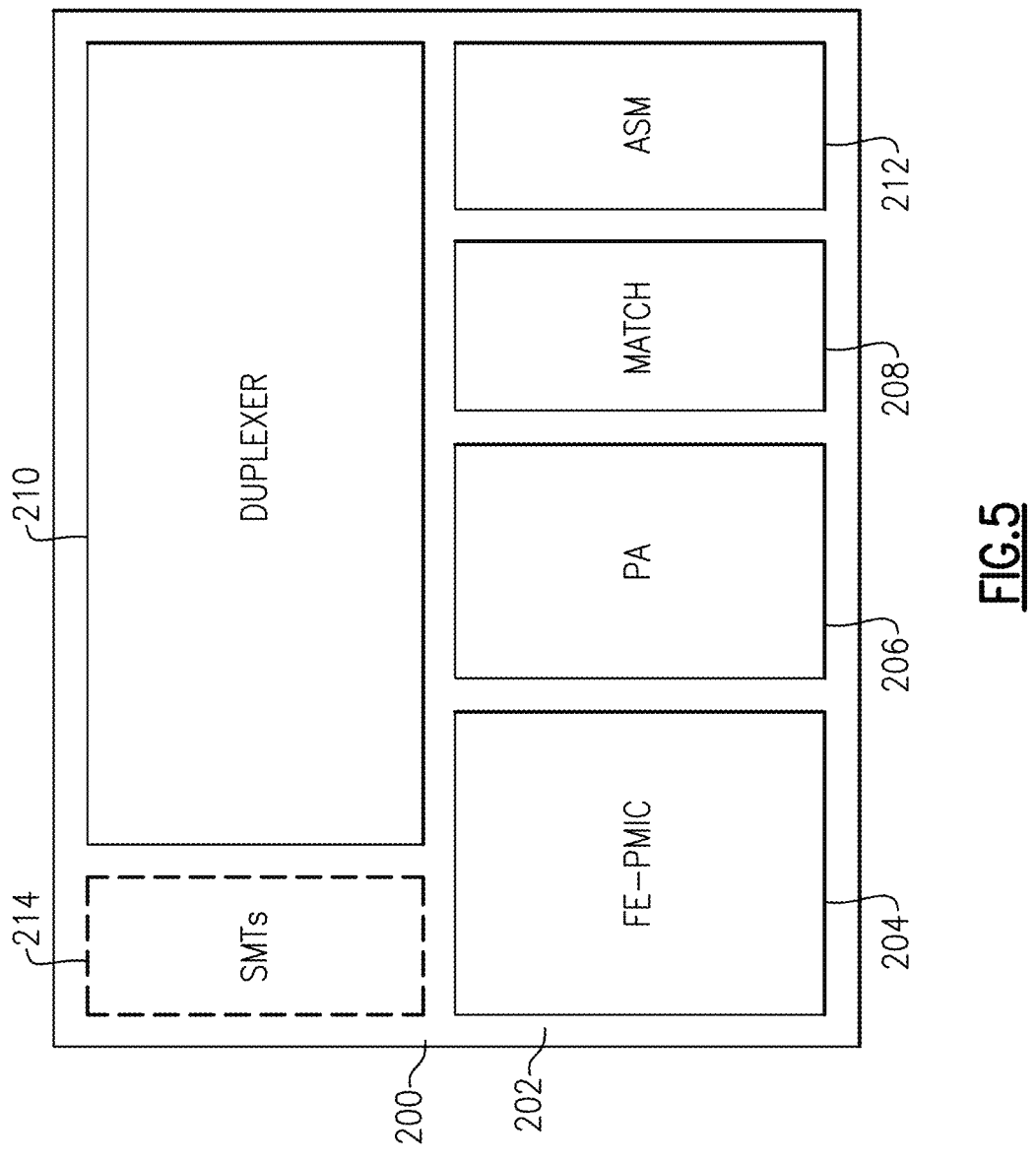
FIG. 5 shows that in some embodiments, power amplification systems can be implemented, wholly or partially, in a module.

FIG. 5 shows that in some embodiments, power amplification systems can be implemented, wholly or partially, in a module. Such a module can be, for example, a front-end module (FEM). In the example of FIG. 5, a module 200 can include a packaging substrate 202, and a number of components can be mounted on such a packaging substrate. For example, an FE-PMIC (Front-end Power Management Integrated Circuit) component 204, a power amplifier assembly 206, a match component 208, and a duplexer assembly 210 can be mounted and/or implemented on and/or within the packaging substrate 202. The power amplifier assembly 206 can include an envelope-based bias component 207. Other components such as a number of SMT (surface-mount technology) devices 214 and an antenna switch module (ASM) 212 can also be mounted on the packaging substrate 202. Although all of the various components are depicted as being laid out on the packaging substrate 202, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smartphone, a hand-held wireless device with or without phone functionality, a wireless tablet, etc.

Figure 6:
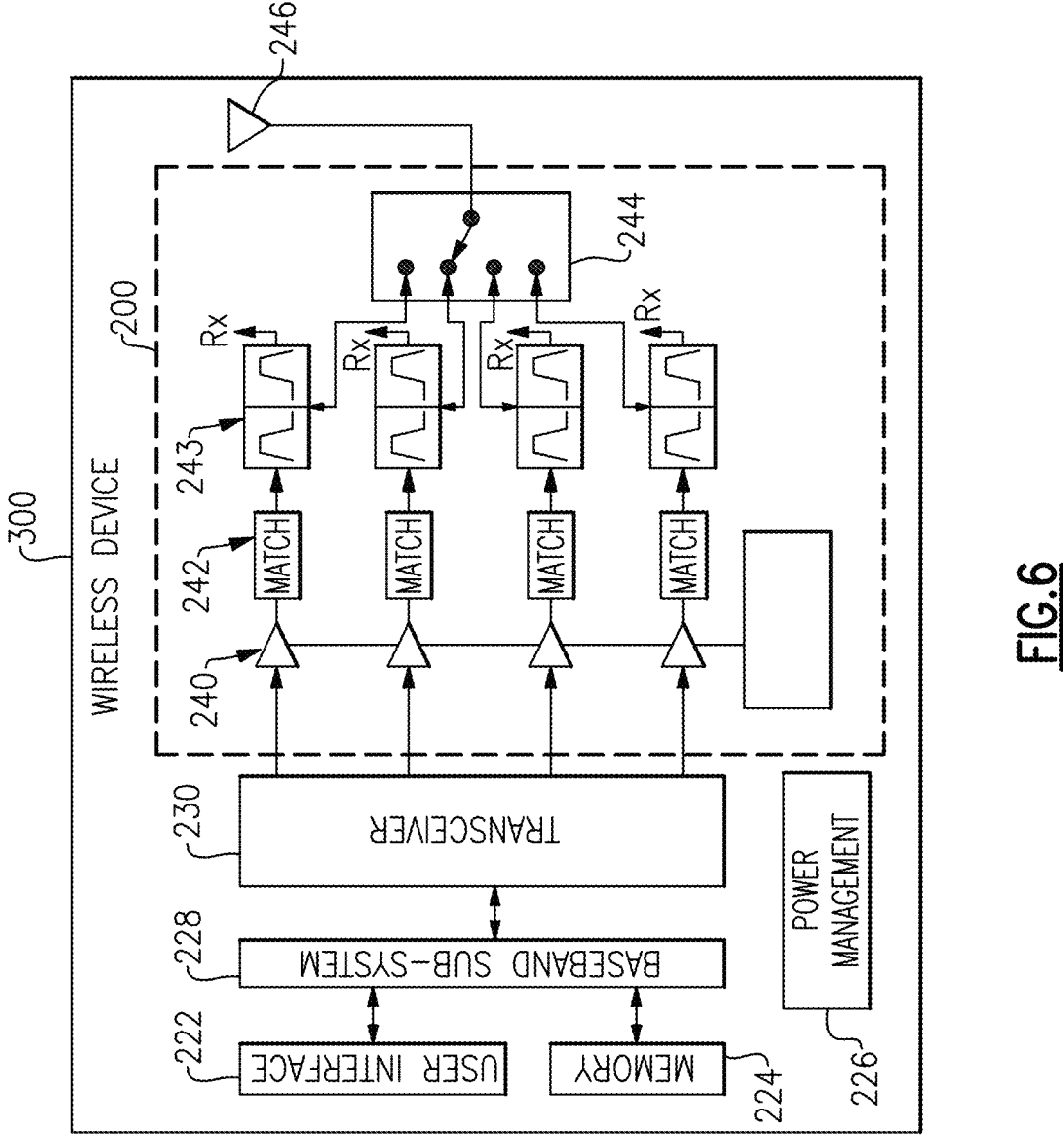
FIG. 6 depicts an example wireless device having one or more advantageous features described herein.

FIG. 6 depicts an example wireless device 300 having one or more advantageous features described herein. In the context of a module having one or more features as described herein, such a module can be generally depicted by a dashed box 200, and can be implemented as, for example, a front-end module (FEM).

Referring to FIG. 6, power amplifiers (PAs) 240 may receive their respective RF signals from a transceiver 230 that can be configured and operated in known manners to generate RF signals to be amplified and transmitted, and to process received signals. The transceiver 230 is shown to interact with a baseband sub-system 228 that is configured to provide conversion between data and/or voice signals suitable for a user and RF signals suitable for the transceiver 230. The transceiver 230 can also be in communication with a power management component 306 that is configured to manage power for the operation of the wireless device 300. Such power management can also control operations of the baseband sub-system 228 and the module 200.

The baseband sub-system 228 is shown to be connected to a user interface 222 to facilitate various input and output of voice and/or data provided to and received from the user. The baseband sub-system 228 can also be connected to a memory 224 that is configured to store data and/or instructions to facilitate the operation of the wireless device, and/or to provide storage of information for the user.

In the example wireless device 300, outputs of the PAs 240 are shown to be matched (via respective match circuits 241) and routed to their respective duplexers 244. Such amplified and filtered signals can be routed to an antenna 245 through an antenna switch 244 for transmission. In some embodiments, the duplexers 324 can allow transmit and receive operations to be performed simultaneously using a common antenna (e.g., 245). In FIG. 6, received signals are shown to be routed to "R$_x$" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as WiFi, Bluetooth, and GPS.

Figure 7:
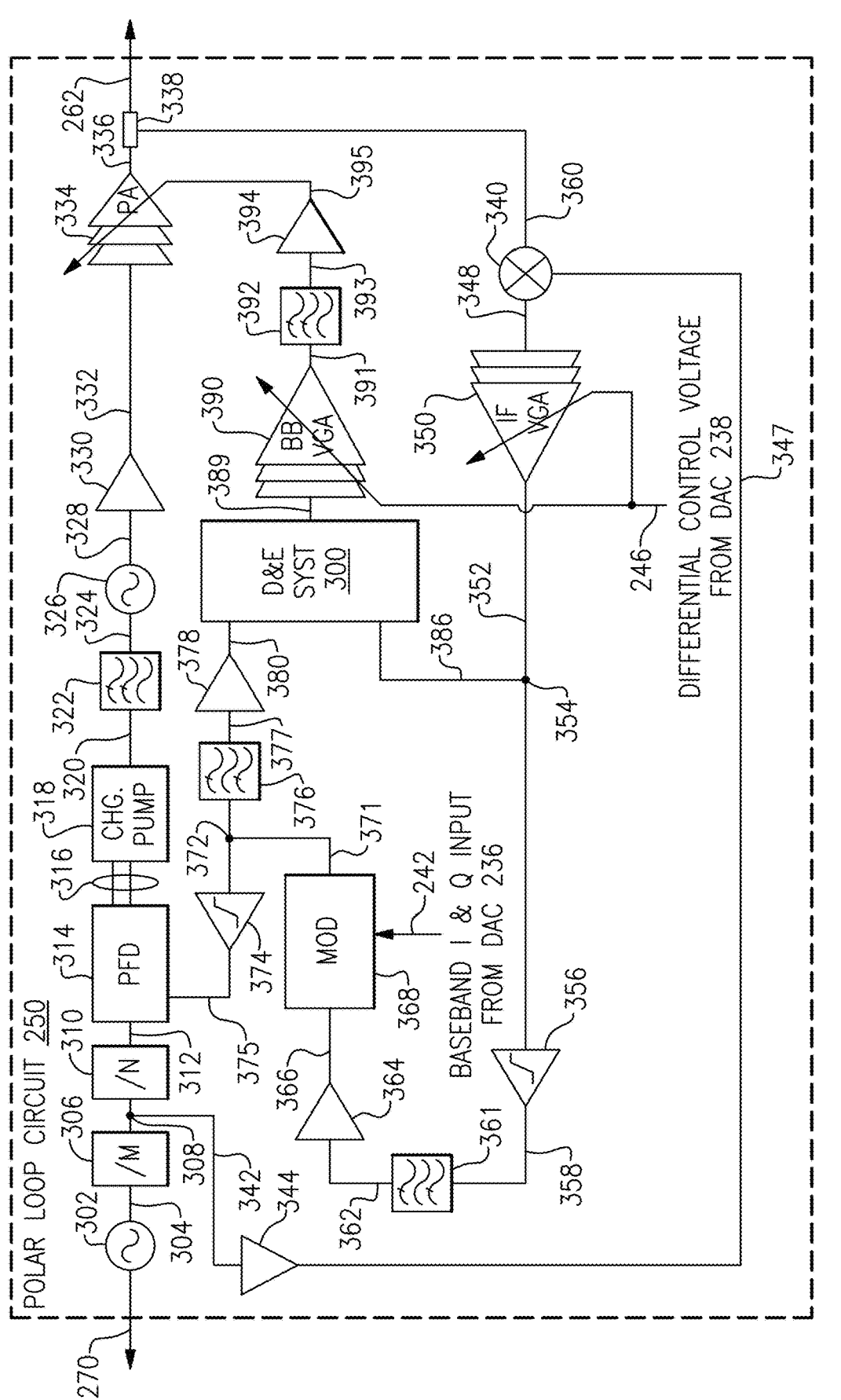
FIG. 7 is a block diagram of the polar-loop circuit that comprises the transmitter portion for the portable transceiver.

FIG. 7 is a block diagram of the polar-loop circuit 250 that comprises the transmitter portion for the portable transceiver. The polar-loop circuit 250 includes phase and amplitude information carried over a phase loop and an amplitude loop. A power amplifier in a modulation arrangement that uses the polar-loop circuit 250 has the amplitude and phase information applied differently to the power amplifier. The phase information is applied to an input port of the power amplifier, where it is amplified and output over an output connection. The amplitude information is used to control the gain of the power amplifier, and is provided to a gain control port of the power amplifier. The power amplifier thus receives an input of changing phase or frequency, but constant amplitude. The control for the power amplifier occurs via a variable amplitude signal applied to the gain control port of the power amplifier, resulting in a varying amplitude signal output for the power amplifier. The phase loop includes a path that has the following components: a UHF voltage controlled oscillator (VCO) 302, dividers 306 and 310, a phase-frequency detector (PFD) 314, a charge pump 318, a low-pass filter (LPF) 322, a transmitter VCO 326, a buffer 330, a power amplifier 334, a coupler 338, a mixer 340, an IF variable gain amplifier (VGA) 350, limiters 356 and 374, a filter 361, an IF buffer 364, and a baseband (BB) modulator 368.

The amplitude loop includes the above components indicated for the phase loop (except for the limiter 374), filters 376 and 392, an amplifier 378, a detection/error extraction system 300, a BB VGA 390, and a buffer 394. Note that some embodiments may have fewer or different components for the amplitude or phase loops.

Starting with the phase loop of the polar-loop circuit 250, the UHF VCO 302 provides a frequency reference signal, also called a "local oscillator" signal, or "LO," on connection 304. The frequency reference signal on connection 304 is divided by a predetermined number M at divider 306. The signal at node 308 is further divided by a predetermined number N at divider 310. The signal at node 308 is also provided to the "LO" buffer 344, as explained below. The dividers 306 and 310 delineate frequency values from the UHF VCO 302 to create transmission channels for a particular user of the module 200. The UHF VCO 302 also provides control signals to the downconverter 284 of FIG. 6 via connection 270.

The divider 310 outputs a signal to the PFD 314 over connection 312. The detected signal is then supplied over connection 316 to the charge pump 318. The charge pump 318 outputs a signal over connection 320 to the low-pass filter 322, where the filtered signal is applied to a transmit VCO 326 via connection 324. The transmit VCO 326 modulates the phase or frequency of the signal on connection 324. The signal output from the transmit VCO 326 over connection 328 is buffered at the buffer 330, and then the buffered signal is supplied over connection 332 to the input of the power amplifier 334.

The output signal of the power amplifier 334 is applied to the coupler 338 via connection 336. A portion of the phase or frequency information from the signal at the coupler 338 is fed back over connection 360 to the mixer 340. The remainder of the energy from the signal at the coupler 338 is supplied to the switch via connection 262. The signal from the switch is supplied to the antenna for transmission.

The mixer 340 also receives a buffered, divided by M signal from the UHF VCO 302, which acts as a local oscillator for the mixer 340 to mix the RF signal at the power amplifier output down to an IF signal. That is, part of the divided by M signal at node 308 is supplied over connection 342 to the "LO" buffer 344. The buffered signal on connection 347 is then supplied to the mixer 340. The RF signal on connection 360 is mixed down to the IF at the mixer 340 and supplied to the IF VGA 350 via connection 348. Connection 246 provides variable control input signals to the IF VGA 350 and the BB VGA 390. The gain of the IF VGA 350 and the BB VGA 390 can be adjusted by varying the gain control signal applied to the connection 246.

The output signal of the IF VGA 350 on connection 352 is applied to two different paths from node 354. Following a first path, the signal leaving node 354 is input to the limiter 356, which strips the amplitude information from the IF signal output from the IF VGA 350. The output signal of the limiter 356 is then supplied on connection 358 to the filter 361, which provides bandpass and/or low-pass filtering functionality. The filtered signal output from the filter 361 is supplied over connection 362 and buffered at the IF buffer 364. The IF buffer 364 outputs the buffered signal over connection 366 to the BB modulator 368. The BB modulator 368 modulates baseband I and Q signals input (via connection 242) to the BB modulator 368 and upconverts the modulated signals carrying the baseband information. For example, in systems conforming to EDGE standards, phase and amplitude information is varied according to a π/8 differential phase-shift keying (DPSK) modulation methodology, thus placing stringent requirements for linearity in power amplification. The baseband I and Q information is provided from DAC over connection 242. The modulated signal is supplied over connection 371 to node 372, where two signal paths are available. Continuing with the phase loop, the modulated signal at node 372 is supplied to the limiter 374, and then back to the PFD 314 via connection 375 to close the phase loop.

Referring now to the amplitude loop, the signal at node 372 is supplied to the bandpass filter 376 and includes both amplitude and phase information (from the modulator 368). The output signal of the bandpass filter 376 is supplied over connection 377 to amplifier 378. The amplifier 378 amplifies the signal on connection 377 and provides an output signal over connection 380 to the detection/error extraction system 300. The detection/error extraction system 300 detects the envelope of the amplitude information present on connection 380, and derives a reference signal that will be subtracted from the IF signal provided by the IF VGA 350.

Similarly, the output signal of the IF VGA 350 present at node 354 is supplied to the detection/error extraction system 300 over connection 386. The detection/error extraction system 300 strips the phase or frequency information from the signals on connections 386, leaving only the amplitude information, thus deriving a feedback signal. The feedback signal and the reference signal are compared in the detection/error extraction system 300, and responsively, an error signal is generated and provided over connection 389. The error signal on connection 389 is input to the BB VGA 390, which amplifies the error signal on connection 389. The amplified signal on connection 391 is filtered at filter 392, and then supplied over connection 393 to buffer 394. The buffer 394 outputs the buffered signal to the power amplifier 334 via gain control connection 395, thus effecting a change in gain of the power amplifier 334.

Thus, the power amplifier 334 receives a signal via connection 332 having constant amplitude information but changing phase or frequency information due primarily to the transmitter VCO 326. However, the output signal of the power amplifier 334 has a variable amplitude, and that variation results from the variation present at the gain control connection 395 corresponding to the variable amplitude information of the output signal of the BB VGA 390. Connection 246 carries the control signals produced at DAC 238 to control the IF VGA 350 and BB VGA 390.

Table 1 shows typical characteristics of AM/PM loops.

TABLE 1

|  | AM Loop | PM Loop |
|---|---|---|
| Loop Gain | 40 dB | ∞ |
| Loop BW | 1.8 MHz | 1.8 MHz |
| Gain Margin | >14 dB | >19 dB |
| Phase Margin | >65° | >65° |
| Attenuation at 20 MHz | >38 dB | >40 dB |

The polar loop may be beneficial to be applied to low modulation BW. ET base bias might work up to 1.4 MHz in an LTE system.

Table 2 shows typical characteristics of loop performance.

TABLE 2

| Modulation/ Band | Parameter | Measured Performance | GSM Requirement |
|---|---|---|---|
| GMSK mode 900 MHz Band | Maximum output power | 33.5 dBm | 31 dBm min/ 33 dBm nom |
| | Modulation Spectrum | −65 dBc | −60 dBc max |
| | 400 kHz offset, 30 kHz BW | −68 dBc | −60 dBc max |
| | 600 kHz offset, 30 kHz BW | | |
| | RMS Phase Error | 1.4° | 5° max |
| | Peak Phase Error | 4.8° | 20° max |
| | Noise 10 MHz offset, 100 kHz BW | −75 dBm | −67 dBm |
| | Noise 20 MHz offset, 100 kHz BW | −80.5 dBm | −79 dBm |
| EDGE Mode 900 MHz Band | Maximum output power | 29 dBm | 24 dBm min/ 27 dBm nom |
| | Modulation Spectrum | −60 dBc | −54 dBc max |
| | 400 kHz offset, 30 kHz BW | −65 dBc | −60 dBc max |
| | 600 kHz offset, 30 kHz BW | | |
| | RMS EVM | 2.9% | 9% max |
| | Peak EVM | 11% | 30% max |
| | 95th percentile EVM | 5.5% | 15% max |
| | Noise 10 MHz offset, 100 kHz BW | −78 dBm | −67 dBm |
| | Noise 20 MHz offset, 100 kHz BW | −83.5 dBm | −79 dBm |
| GMSK Mode 1800 mHz Band | Maximum output power | 30.5 dBm | 28 dBm min/ 30 dBm nom |
| | Modulation Spectrum | −64 dBc | −60 dBc max |
| | 400 kHz offset, 30 kHz BW | −67 dBc | −60 dBc max |
| | 600 kHz offset, 30 kHz BW | | |
| | RMS Phase Error | 1.6° | 5° max |
| | Peak Phase Error | 6.0° | 20° max |
| | Noise 20 MHz offset, 100 kHz BW | −75 dBm | −71 dBm |
| EDGE Mode 1800 MHz Band | Maximum output power | 26.5 dBm | 22 dBm min/ 26 dBm nom |
| | Modulation Spectrum | −60 dBc | −54 dBc max |
| | 400 kHz offset, 30 kHz BW | −64 dBc | −60 dBc max |
| | 600 kHz offset, 30 kHz BW | | |
| | RMS EVM | 3.8% | 9% max |
| | Peak EVM | 13% | 30% |
| | 95th percentile EVM | 7.3% | 15% max |
| | Noise 20 MHz offset, 100 kHz BW | −78 dBm | −71 dBm |

In Table 2, the GMSK Mode represents an example of a conventional mode without a polar loop, whereas the EDGE mode represents an example of an ET system with a polar loop with low modulation bandwidth compared with LTE & 5G systems, according to an embodiment of the present disclosure, which has very low noise level.

Figure 8:
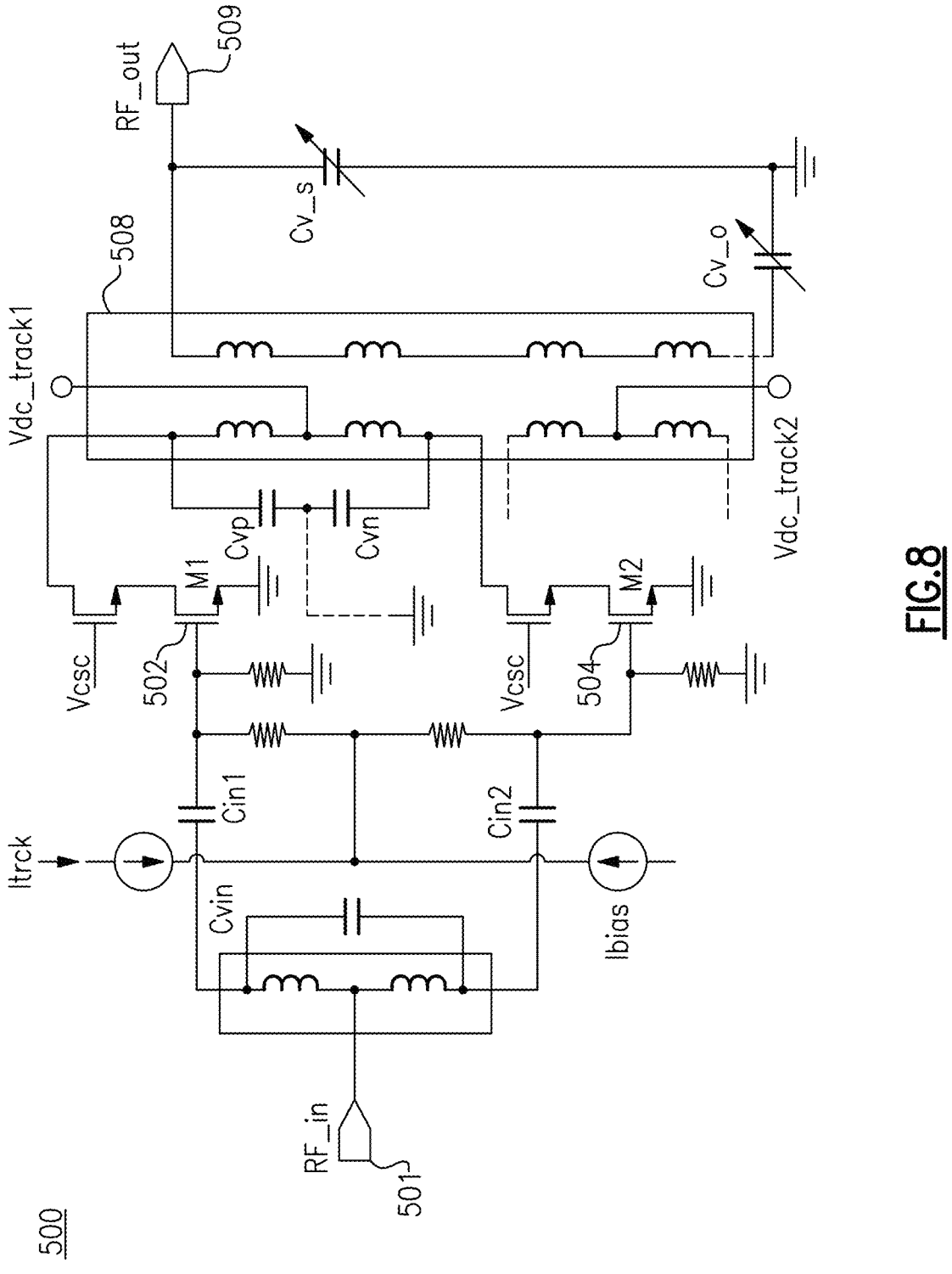
FIG. 8 illustrates an example power amplifier system with a transformer-based combiner.

FIG. 8 illustrates power amplifier system 500 with a transformer-based combiner 508 according to an example. The power amplifier system 500 includes power amplifiers 502, 504 that are biased based on a combination of the input signal RF_in received at input port 501 and the tracking signal based bias current Itrck. The current bias Itrck can be configured to bias the amplifier structure in an advantageous, targeted, or optimal operating region. The power amplifiers 502, 504 are respectively powered by tracking signals Vdc_trck1, Vdc_trck2, generated as described herein. Each power amplifier 502, 504 includes variable capacitors Cvp, Cvn coupled to a signal path providing the tracking signals through one or more inductors. The inductors serve to couple amplified signals to respective paths on an output portion of the combiner 508, the amplified signals being combined to provide a combined output at the output port 509. The output path includes variable capacitors Cv_s, Cv_o providing paths to a reference potential (e.g., ground). These capacitors Cv_s, Cv_o are used for load tuning. In some embodiments, the power amplifiers are integrated using GaAs or Silicon technology with the output match and combiner 508 using a Class E structure. The power amplifier system 500 can be extended for use with two or more power amplifiers for higher power and intra-band carrier aggregation (CA).

Meanwhile, the 5G NR for low latency and mini slots requires fast power amplifier (PA) transition depending on a modulation bandwidth of the RF signal. The modulation bandwidth is determined by a number of resource blocks (RBs) included in a carrier. A resource block is the smallest unit of resources that can be allocated to a user. Depending on the modulation bandwidth, the output power of the PA can be varied in an envelope tracking (ET) system. 5G NR has been designed to have broader modulation bandwidth, and the configuration of mini slots needs fast adaptation of ET operation of the PA.

However, the (direct current) DC tracking loop is usually not able to respond quickly. Therefore, it is desired to develop an ET system that is suitable for both 5G NR and low RB conditions. Low RBs reduce also the modulation bandwidth for the system.

According to an embodiment of the present disclosure, hybrid ET with (alternating current) AC coupling can be used for high 5G bandwidth, a DC tracking loop not being used. Meanwhile, constant Vdd is used for low RBs with ET modulation for PA bias and a closed loop DC tracking loop. According to an embodiment, fast transition for high RBs is supported, and the overall efficiency can be improved for low RBs by about 56% to 60%. For the low RBs, modulating PA bias based on the ET signal keeps the PA noise very low. This will aid in operation in 5G bands n77/n78 and NSA bands, utilizing fast ET mode switching for mini slots. In addition, FEMiD integration is proposed for 5G.

Figure 9:
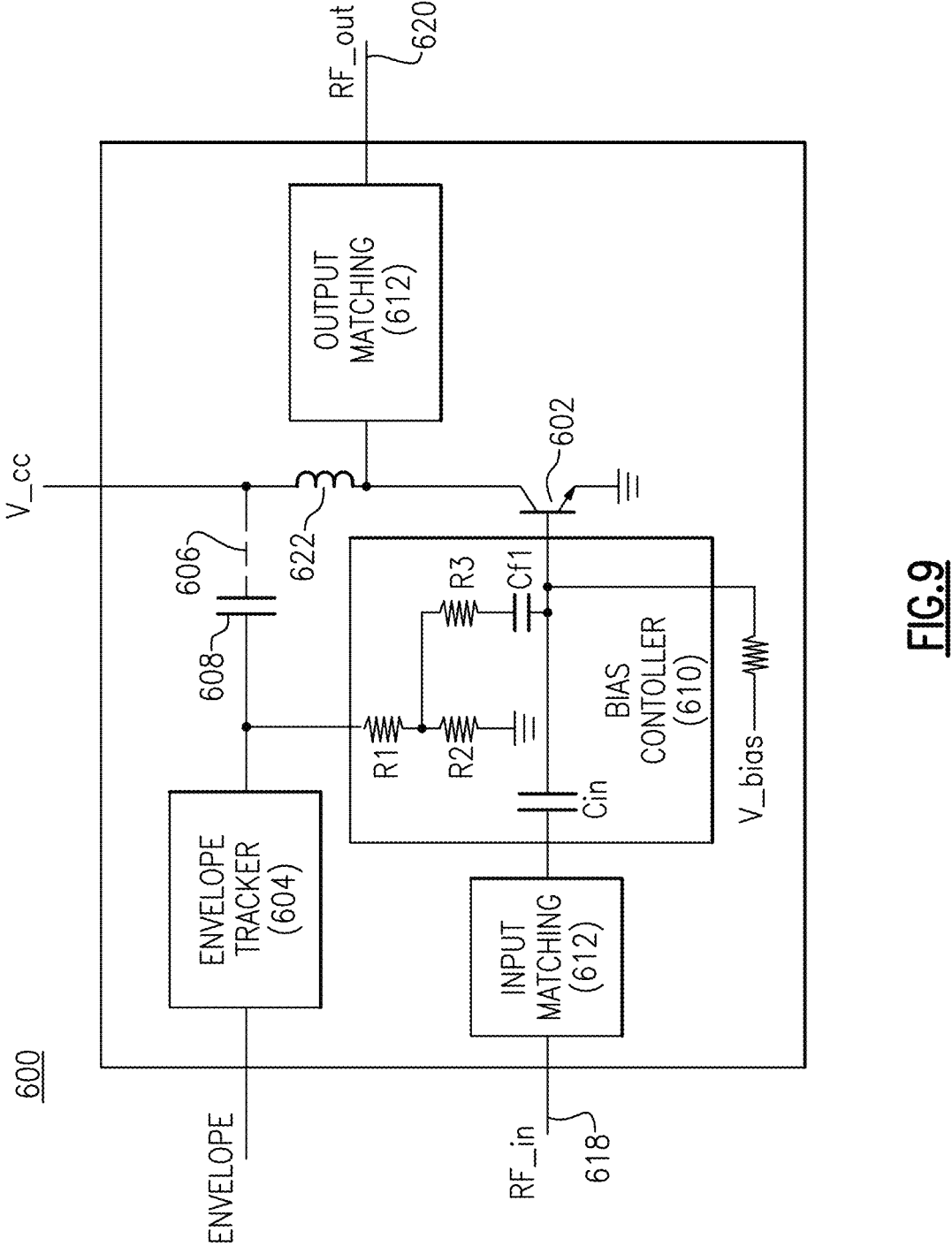
FIG. 9 is an example of schematic diagram of power amplification system according to an embodiment of the present disclosure.

FIG. 9 is an example of schematic diagram of power amplification system according to an embodiment of the present disclosure.

As shown in FIG. 9, the power amplification system 600 according to an embodiment of the present disclosure includes a power amplifier 602, an envelope tracker 604, a mode controller 606, a supply voltage controller 608, and a bias controller 610.

The power amplifier 602 is configured to amplify an input radio frequency (RF) signal to generate an output RF signal. In FIG. 9, the power amplifier 602 is illustrated as a bipolar transistor, but the type of power amplifier is not limited thereto. For example, MOSFET may be alternatively used as power amplifier. The power amplifier 602 is configured to amplify the input RF signal, when powered by a supply voltage and biased by a biasing signal. According to an embodiment, the power amplifier 602 may be implemented according to the example illustrated in FIG. 8.

The biasing signal is input to a base of the power amplifier 602. The biasing signal may be generated based on an envelope signal. In this embodiment, the biasing signal may be defined in current value. As will be described in more detail, the biasing signal is controlled by the bias controller 610.

The input RF signal is received via an input node 618 of the power amplification system 600. The received RF signal passes through an input matching circuit 612 in order to prevent reflection of the input RF signal. The RF signal passing through the input matching circuit 612 goes into the bias controller 610. The biasing signal is generated and provided by the bias controller 610 to the base of the power amplifier 602.

The envelope tracker 604 is configured to generate an envelope signal that changes in relation to an envelope of the input RF signal. The enveloper tracker 604 may be operated similar to a conventional envelope tracker.

The mode controller 606 is configured to an envelope tracking (ET) mode of the power amplification system based on a modulation bandwidth of the input RF signal. The mode controller 606 is configured to receive information of the modulation bandwidth of the input RF signal. The modulation bandwidth of the input RF signal is the number of resource blocks modulated in a unit carrier. The unit carrier may be defined, for example, in a unit time (frame) or window. For example, the number of resource blocks may be 270 RBs or 1 RB.

The information of the modulation bandwidth of the input RF signal may be received from a certain pre-existing element of the transmitter, or detected by an additional element of the transmitter.

The mode controller 606 is configured to select the ET mode depending on the modulation bandwidth of the input RF signal. The ET modes of the power amplification system 600 may include a first mode and a second mode. Depending on the ET modes, the signal path of envelope signal is determined. The first mode may be suitable for high modulation bandwidth of the input RF signal, such as to be able to support a fast transition of the power amplification system 600. The second mode may be suitable for low modulation bandwidth of the input RF signal, and the second mode according to an embodiment aids in minimizing the noise of the output RF signal.

The mode controller 606 is configured to set the ET mode to the first mode when the modulation bandwidth is higher than a threshold value. In this case, the mode controller 606 activates the supply voltage controller 608 to control the supply voltage. The mode controller 606 is configured to set the ET mode to the second mode when the modulation bandwidth is lower than the threshold value. In this case, the mode controller 606 activates the bias controller 610 to control the biasing signal.

The supply voltage controller 608 is configured to control the supply voltage based on the envelope signal when the ET mode is set to a first mode. The supply voltage controller 608 may include an AC coupler to filter out the DC component of the envelope signal. As shown in FIG. 9, the filtered envelope signal is combined with a supply voltage Vcc provided by power source and routed into an inductor 622 connected to a collector of the power amplifier 602 and an input matching circuit 614. According to an embodiment, the mode controller 606 is coupled between the supply voltage controller 608 and a node connecting a power source and the power amplifier 602. The signal generated at the collector of the power amplifier 602 is output to the output node 620 through the output matching circuit 616.

The bias controller 610 is configured to control the biasing signal based on the envelope signal when the ET mode is set to a second mode. The bias controller 610 is configured to generate the biasing signal based on the envelope signal and a bias voltage Vbias. The generated biasing signal is applied to the base of the power amplifier 602. According to an embodiment, the bias controller 610 may include a voltage divider R1, R2, and an RC series circuit, R3, Cf1. The bias controller 610 further includes an input capacitor Cin configured to filter out the DC component of the input RF signal.

In the first mode, Vbias is applied to the base of the power amplifier 602 together with the filtered input RF signal. In the second mode, Vcc is applied to the collector of the power amplifier 602 through the inductor 622.

According to an embodiment of the present disclosure, the bias controller 610 includes a feedback loop (not shown) to detect the output RF signal. The biasing signal can be adjusted by the bias controller 610 further based on the detected output RF signal.

The bias controller 610 may be include a polar loop circuit, for example as illustrated in FIG. 7. Therefore, the bias controller 610 is capable of detecting the output RF signal and feeding it back to the biasing signal. By using the polar loop circuit illustrated in FIG. 7, the noise of the RF signal can be significantly reduced.

The bias controller 610 may further include an adjustment circuit to adjust the input RF signal based on the detected output RF signal to enhance a linearity of the power amplification system. The adjustment circuit may be a digital pre-distortion (DPD) circuit. When the bias controller 610 is configured to generate a multi-level biasing signal based on the envelope signal, the linearity of the output RF signal should be guaranteed by adjusting the input RF signal using DPD.

Figure 10:
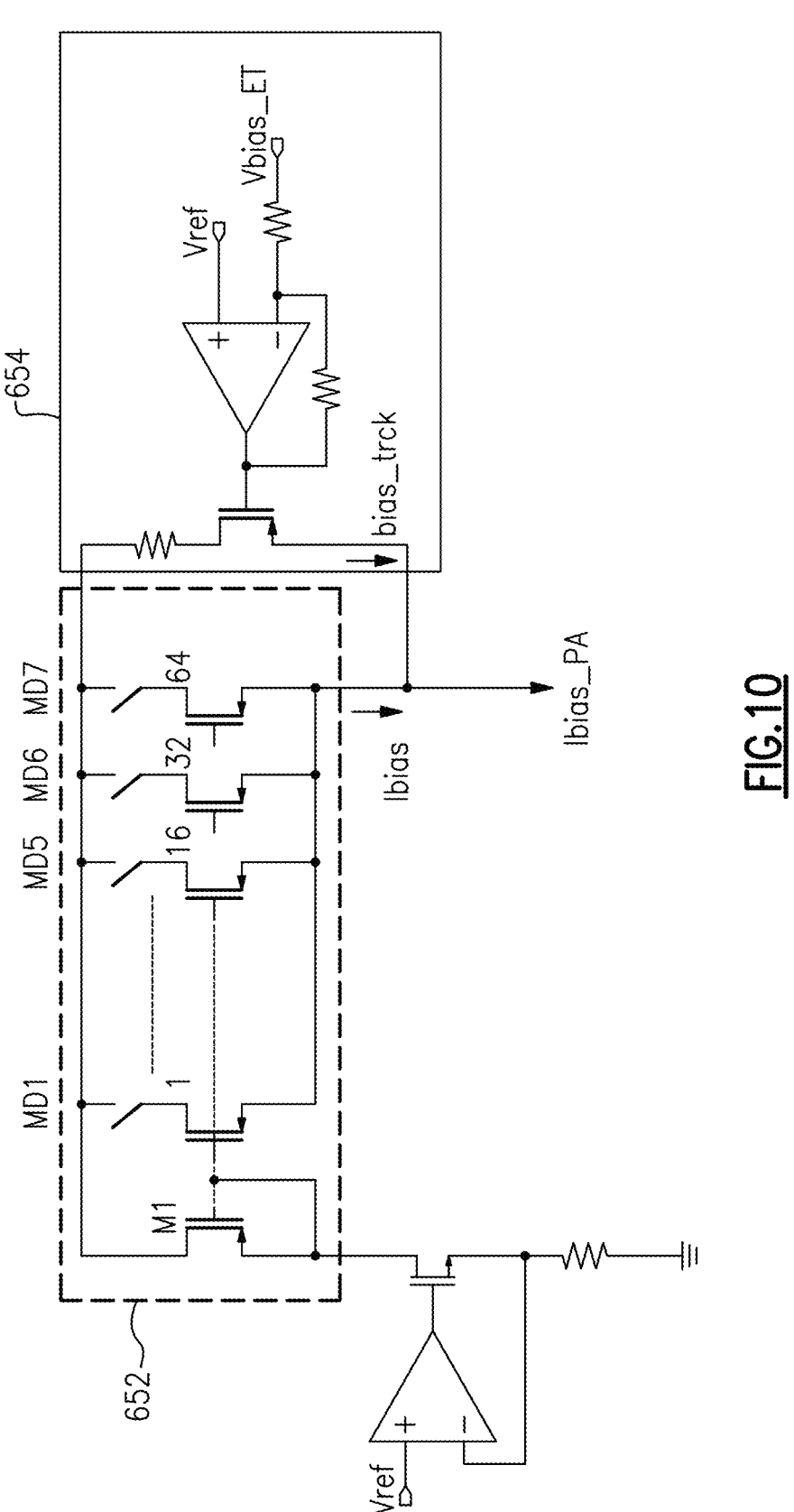
FIG. 10 is an example of schematic diagram of bias controller according to an embodiment of the present disclosure.

FIG. 10 is an example of schematic diagram of bias controller 610 according to an embodiment of the present disclosure. As illustrated in FIG. 10, the bias controller 610 includes a bias current generator 652, and an ET based bias controller 654.

The bias current generator 652 may include a plurality of switches (M1, MD1, . . . , MD7) in order to control the amount of bias current (Ibias). More specifically, the bias current generator 652 may generate different values of bias current depending on a number of activated switches.

The ET based bias controller 654 is configured to generate an ET based bias current (bias_trck). The ET based bias current is combined with the bias current generated by the bias current generator 652, and the combined current (Ibias_PA) is applied to the base of power amplifier 602.

Figure 11:
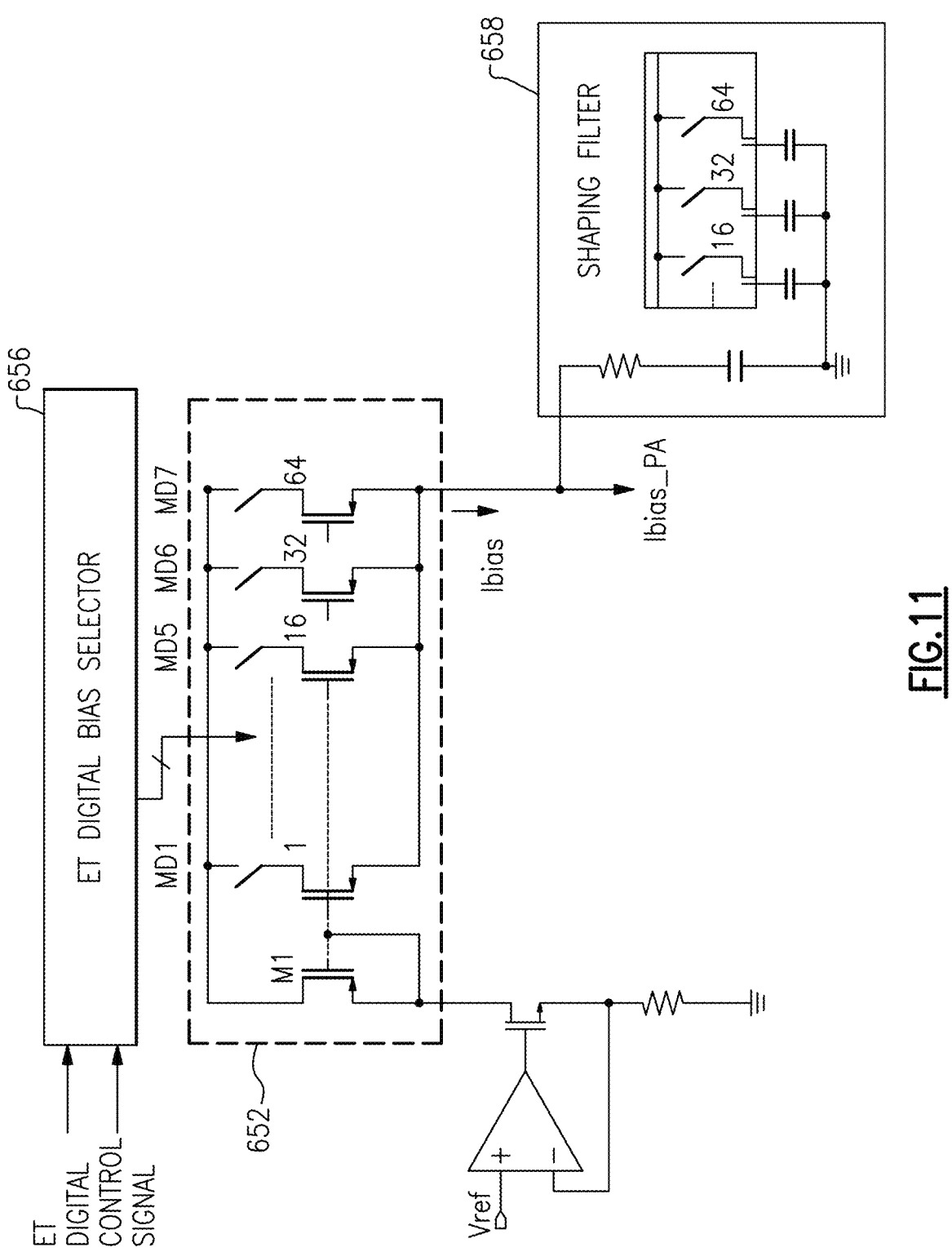
FIG. 11 is another example of schematic diagram of bias controller according to an embodiment of the present disclosure.

FIG. 11 is another example of schematic diagram of bias controller 610' according to an embodiment of the present disclosure. As shown in FIG. 11, the bias controller 610' may include a bias current generator 652 and an ET digital bias selector 656. In certain implementations, the bias controller 610' may further include a shaping filter 658.

The ET digital bias selector 656 may receive an ET digital control signal. The ET digital bias selector 656 may generate two bits of a digital signal. However, the ET digital bias selector 656 may generate multiple bits of a digital signal (multi-level signal). In case of a multi-level signal, the ET bias digital selector 656 may further include an up-down counter and a de-multiplexer. The number of bits can be programmed based on the modulation bandwidth, with more resolution for lower modulation bandwidth.

The shaping filter 658 may be optionally added to be more suitable for lower modulation bandwidth. The shaping filter 658 may include a plurality of switches and capacitors connected in series with the corresponding switches.

Figure 12:
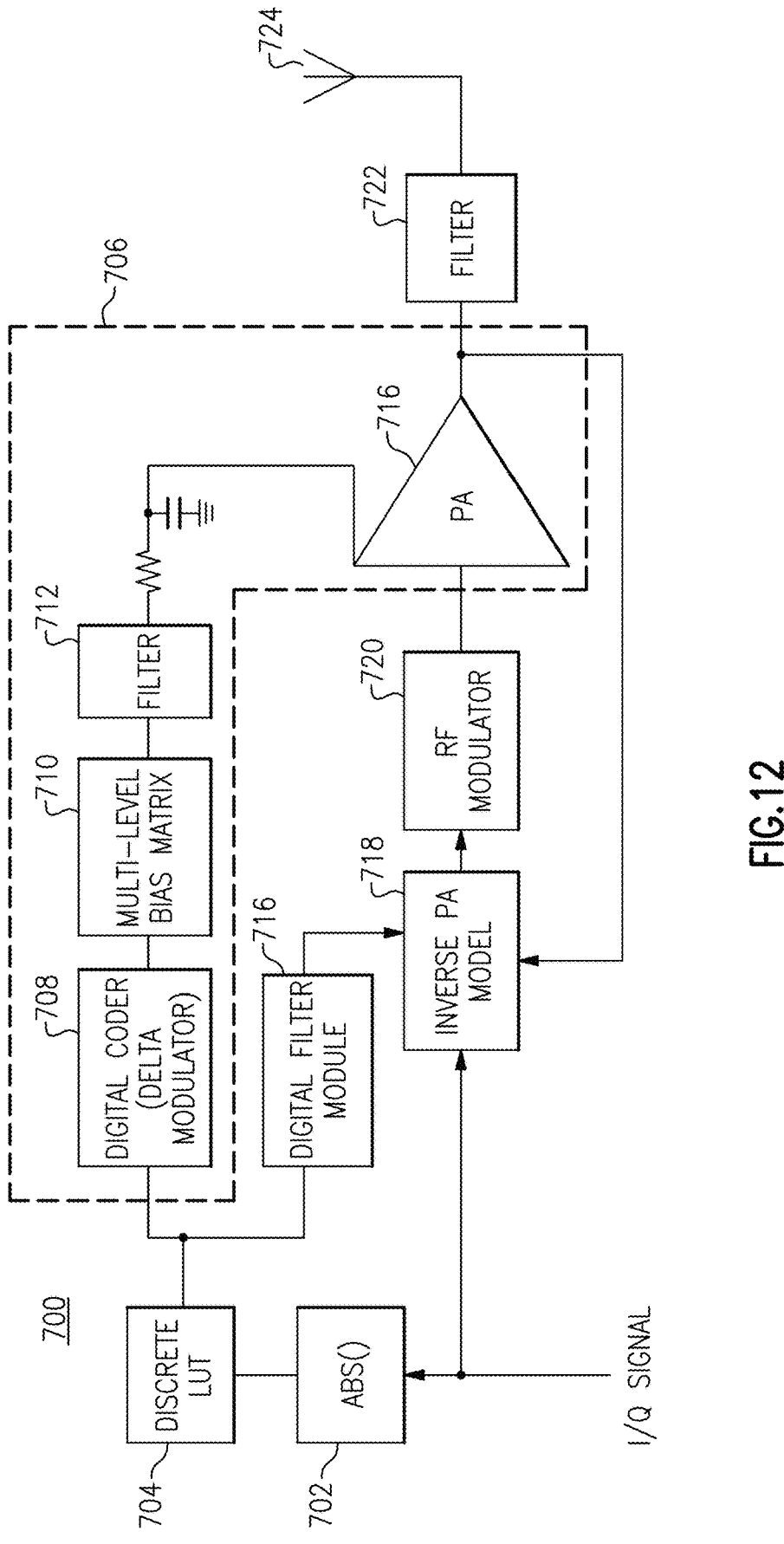
FIG. 12 is an example of schematic diagram of power amplification system according to an embodiment of the present disclosure.

FIG. 12 is an example of schematic diagram of a power amplification system 700 according to an embodiment of the present disclosure.

In FIG. 12, the power amplification system 700 is illustrated particularly with focus on the details of the digital bias control (modulation) of the power amplifier in the PA module. The power amplification system 700 shown in FIG. 12 may be operated to take advantage of the multi-level bias settings and advanced timing control with DPD.

As shown in FIG. 12, the power amplification system 700 includes a PA module 706. The PA module 706 includes a digital coder (delta modulator) 708, a multi-level bias matrix 710, a filter 712, and a power amplifier 716. The PA module 706 is configured to receive an envelope signal. The digital coder (delta modulator) 708, the multi-level bias matrix 710 and the filter 712 are configured to generate a biasing signal based on the envelope signal. In this embodiment, the biasing signal may have multi-level (discrete) values. The generated biasing signal is applied to a power amplifier 716. The output RF signal generated by the power amplifier 716 is sent to an antenna 724 via a filter 722.

According to an embodiment of the present disclosure, the biasing signal is controlled when modulation bandwidth of the RF signal is lower than a threshold value. That is, the biasing signal is controlled in case of low RB modulation.

The output RF signal of the power amplifier 716 can be fed back to the inverse PA model 718 in order to adjust the input RF signal. By adjusting the input RF signal at the inverse PA model 718, the linearity of output RF signal can be improved. Particularly, in case the biasing signal is discrete multi-level values, linearity of the PA operation is desired. The inverse PA model 718 also receives I/Q signals and an output signal from a digital filter module 726. The RF modulator 720 connected between inverse PA model 718 and the power amplifier 716 is configured to generate the RF signal. According to an embodiment of the present disclosure, the inverse PA model 718 may be implemented by digital pre-distortion (DPD) circuit.

Figure 13A:
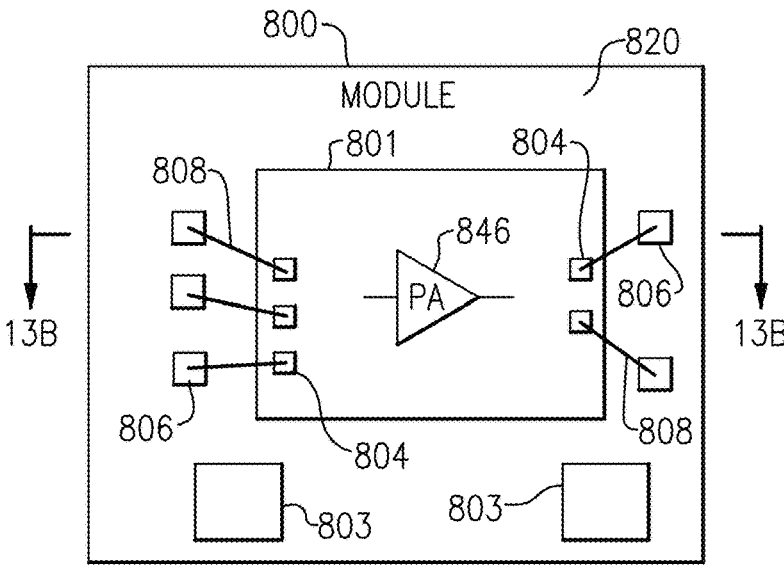
FIG. 13A is a schematic diagram of one embodiment of a packaged module.
Figure 13B:
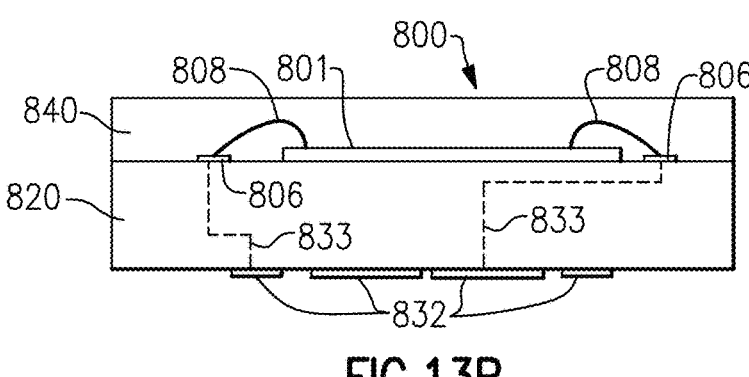
FIG. 13B is a schematic diagram of a cross-section of the packaged module of FIG. 13A taken along the lines 13A-13B.

FIG. 13A is a schematic diagram of one embodiment of a packaged module 800. FIG. 13B is a schematic diagram of a cross-section of the packaged module 800 of FIG. 8A taken along the lines 13A-13B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a power amplifier 846, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 13B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 8B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 14:
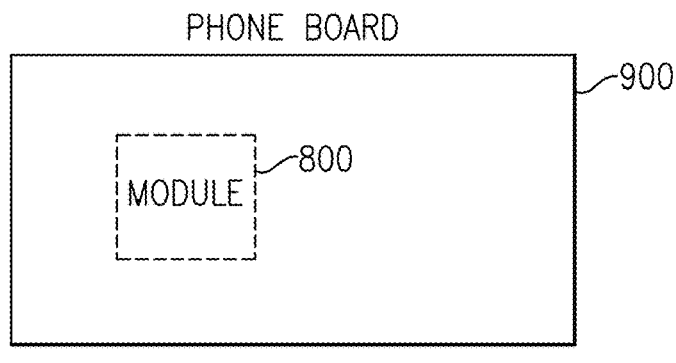
FIG. 14 is a schematic diagram of one embodiment of a phone board.

FIG. 14 is a schematic diagram of one embodiment of a phone board 900. The phone board 900 includes the module 800 shown in FIGS. 13A-13B attached thereto. Although not illustrated in FIG. 14 for clarity, the phone board 900 can include additional components and structures.

Applications

Some of the embodiments described above have provided examples in connection with wireless devices or mobile phones. However, the principles and advantages of the embodiments can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
a power amplifier configured to amplify an input radio frequency signal to generate an output radio frequency signal when powered by a supply voltage and biased by a biasing signal;
an envelope tracker configured to generate an envelope signal that changes in relation to an envelope of the input radio frequency signal;
a mode controller configured to set an envelope tracking mode of the power amplification system based on a modulation bandwidth of the input radio frequency signal;

a supply voltage controller, the mode controller disposed between the supply voltage controller and a node connecting a power source and the power amplifier, the mode controller configured to couple the supply voltage controller to the node to control the supply voltage based on the envelope signal when the envelope tracking mode is set to a first mode; and
a bias controller configured to control the biasing signal based on the envelope signal when the envelope tracking mode is set to a second mode.

2. The power amplification system of claim 1 wherein the mode controller is configured to set the envelope tracking mode to the first mode when the modulation bandwidth of the input radio frequency signal is higher than a threshold value.

3. The power amplification system of claim 1 wherein the mode controller is configured to set the envelope tracking mode to the second mode when the modulation bandwidth of the input radio frequency signal is lower than a threshold value.

4. The power amplification system of claim 1 wherein the modulation bandwidth of the input radio frequency signal is determined based on a number of resource blocks included in a single carrier.

5. The power amplification system of claim 1 wherein the bias controller is configured to generate a multi-level biasing signal based on the envelope signal.

6. The power amplification system of claim 1 wherein the bias controller includes a feedback loop to detect the output radio frequency signal.

7. The power amplification system of claim 6 wherein the biasing signal is controlled further based on the detected output radio frequency signal.

8. The power amplification system of claim 6 wherein the bias controller further includes an adjustment circuit to adjust the input radio frequency signal based on the detected output radio frequency signal to enhance a linearity of the power amplification system.

9. The power amplification system of claim 8 wherein the adjustment circuit is a digital pre-distortion circuit.

10. The power amplification system of claim 1 wherein the supply voltage controller includes an AC coupler to extract an AC component of the envelope signal and to provide the supply voltage with the extracted AC component of the envelope signal when the envelope tracking mode is set to the first mode.

11. A power amplification system comprising:
a power amplifier configured to amplify an input radio frequency signal to generate an output radio frequency signal when powered by a supply voltage and biased by a biasing signal;
an envelope tracker configured to generate an envelope signal that changes in relation to an envelope of the input radio frequency signal;
a mode controller configured to set an envelope tracking mode of the power amplification system based on a modulation bandwidth of the input radio frequency signal;
a supply voltage controller including an AC coupler configured to extract an AC component of the envelope signal, the mode controller configured to, when the envelope tracking mode is set to a first mode, couple the supply voltage controller to a node connecting a power source and the power amplifier such that the supply voltage controller provides the supply voltage with the extracted AC component of the envelope signal to control the supply voltage based on the envelope signal; and a bias controller configured to control the biasing signal based on the envelope signal when the envelope tracking mode is set to a second mode.

12. The power amplification system of claim 11 wherein the mode controller is disposed between the supply voltage controller and a node connecting a power source and the power amplifier.

13. A radio frequency system comprising:

a packaging substrate configured to receive a plurality of components; and a power amplification system implemented on the packaging substrate, the power amplification system including a power amplifier configured to amplify an input radio frequency signal to generate an output radio frequency signal when powered by a supply voltage and biased by a biasing signal, an envelope tracker configured to generate an envelope signal that changes in relation to an envelope of the input radio frequency signal, a mode controller configured to set an envelope tracking mode of the power amplification system based on a modulation bandwidth of the input radio frequency signal, a supply voltage controller including an AC coupler configured to extract an AC component of the envelope signal, the mode controller configured to, when the envelope tracking mode is set to a first mode, couple the supply voltage controller to a node connecting a power source and the power amplifier such that the supply voltage controller provides the supply voltage with the extracted AC component of the envelope signal to control the supply voltage based on the envelope signal, and a bias controller configured to control the biasing signal based on the envelope signal when the envelope tracking mode is set to a second mode.

14. The radio frequency system of claim 13 wherein the radio frequency system is a front-end module.

15. The radio frequency system of claim 13 wherein the mode controller is configured to set the envelope tracking mode to the first mode when the modulation bandwidth of the input radio frequency signal is higher than a threshold value.

16. The radio frequency system of claim 13 wherein the mode controller is configured to set the envelope tracking mode to the second mode when the modulation bandwidth of the input radio frequency signal is lower than a threshold value.

17. The radio frequency system of claim 13 wherein the modulation bandwidth of the input radio frequency signal is determined based on a number of resource blocks included in a single carrier.

18. The radio frequency system of claim 13 wherein the bias controller is configured to generate a multi-level biasing signal based on the envelope signal.

19. A radio frequency system comprising:

a packaging substrate configured to receive a plurality of components; and a power amplification system implemented on the packaging substrate, the power amplification system including a power amplifier configured to amplify an input radio frequency signal to generate an output radio frequency signal when powered by a supply voltage and biased by a biasing signal, an envelope tracker configured to generate an envelope signal that changes in relation to an envelope of the input radio frequency signal, a mode controller configured to set an envelope tracking mode of the power amplification system based on a modulation bandwidth of the input radio frequency signal, a supply voltage controller, the mode controller disposed between the supply voltage controller and a node connecting a power source and the power amplifier, the mode controller configured to couple the supply voltage controller to the node to control the supply voltage based on the envelope signal when the envelope tracking mode is set to a first mode, and a bias controller configured to control the biasing signal based on the envelope signal when the envelope tracking mode is set to a second mode.

20. The radio frequency system of claim 13 wherein the supply voltage controller includes an AC coupler to extract an AC component of the envelope signal and to provide the supply voltage with the extracted AC component of the envelope signal when the envelope tracking mode is set to the first mode.

* * * * *